United States Patent
Clay, Jr. et al.

(10) Patent No.: US 12,212,822 B2
(45) Date of Patent: Jan. 28, 2025

(54) IMAGER OPTICAL SYSTEMS AND METHODS

(71) Applicant: Teledyne FLIR Commercial Systems, Inc., Goleta, CA (US)

(72) Inventors: Royce Duane Clay, Jr., Santa Barbara, CA (US); Devin T. Walsh, Goleta, CA (US); Darren M. Haley, Santa Barbara, CA (US); William E. Williamson, Orcutt, CA (US)

(73) Assignee: Teledyne FLIR Commercial Systems, Inc., Goleta, CA (US)

( * ) Notice: Subject to any disclaimer, the term of this patent is extended or adjusted under 35 U.S.C. 154(b) by 798 days.

(21) Appl. No.: 17/428,267

(22) PCT Filed: Jan. 31, 2020

(86) PCT No.: PCT/US2020/016261
§ 371 (c)(1),
(2) Date: Aug. 3, 2021

(87) PCT Pub. No.: WO2020/163183
PCT Pub. Date: Aug. 13, 2020

(65) Prior Publication Data
US 2022/0124261 A1    Apr. 21, 2022

Related U.S. Application Data

(60) Provisional application No. 62/833,606, filed on Apr. 12, 2019, provisional application No. 62/801,024, filed on Feb. 4, 2019.

(51) Int. Cl.
*H04N 23/11* (2023.01)
*G01J 3/28* (2006.01)
*H01L 31/0232* (2014.01)

(52) U.S. Cl.
CPC ............ *H04N 23/11* (2023.01); *G01J 3/2803* (2013.01); *G01J 3/2823* (2013.01); *H01L 31/0232* (2013.01)

(58) Field of Classification Search
CPC ......... H04N 23/11; H04N 5/33; G01J 3/2803; G01J 3/0297; G01J 2005/065; G01J 5/06;
(Continued)

(56) References Cited

U.S. PATENT DOCUMENTS

| 9,829,384 B2 | 11/2017 | Pezzaniti et al. |
| 2007/0170359 A1 | 7/2007 | Syllaios et al. |

(Continued)

FOREIGN PATENT DOCUMENTS

EP    3389092 A1    10/2018

OTHER PUBLICATIONS

PCT Search Report and Written Opinion for International Patent Application No. PCT/US2020/016261, mailed May 29, 2020, 14 pages.

(Continued)

*Primary Examiner* — David P Porta
*Assistant Examiner* — Meenakshi S Sahu
(74) *Attorney, Agent, or Firm* — Haynes and Boone, LLP

(57) ABSTRACT

Techniques are disclosed for optical imager devices, systems, and methods. In one example, an imaging system includes a focal plane array (FPA) and a light shield. The FPA includes a detector array configured to detect a first portion of electromagnetic radiation and generate a detector signal based on the first portion. The FPA further includes a readout circuit coupled to the detector array and configured to receive the detector signal. The light shield is coupled to the FPA and configured to block a second portion of the electromagnetic radiation. Related devices and methods are also provided.

20 Claims, 26 Drawing Sheets

(58) Field of Classification Search
CPC ........... H01L 31/0232; H01L 27/14623; H01L 27/1465
See application file for complete search history.

(56) References Cited

U.S. PATENT DOCUMENTS

| | | | | |
|---|---|---|---|---|
| 2007/0290132 | A1* | 12/2007 | Tennant | ............ H01L 27/14627 438/69 |
| 2013/0016220 | A1* | 1/2013 | Brown | .................. H04N 23/11 359/359 |
| 2015/0226613 | A1 | 8/2015 | Bauer et al. | |

OTHER PUBLICATIONS

Beekman et al., "Polarization Sensitive QWIP Thermal Imager", Infrared Physics & Technology, 2001, pp. 232-328, vol. 42—Issues 3-5, Elsevier, United States of America.

SCD Semiconductor Devices, "Cardinal 640 Low Noise (LOON)", Cardinal 640 Low Noise Datasheet, Jul. 2019, 2 pages, SCD Semiconductor Devices, Haifa, Israel.

SCD Semiconductor Devices, "Cardinal 1280 HD", Cardinal 1280 HD Datasheet, Jul. 2019, 2 pages, SCD Semiconductor Devices, Haifa, Israel.

Hamamatsu Photonics K.K., "InGaAs Area Image Sensor", G11097-0606S Datasheet, Oct. 2019, 9 pages, Hamamatsu Photonics K.K., Hamamatsu City, Japan.

Hamamatsu Photonics K.K., "InGaAs Area Image Sensor", G11097-0707S Datasheet, Jun. 2014, 9 pages, Hamamatsu Photonics K.K., Hamamatsu City, Japan.

Hamamatsu Photonics K.K., "InGaAs Area Image Sensor", G13393-0909W Datasheet, Dec. 2017, 11 pages, Hamamatsu Photonics K.K., Hamamatsu City, Japan.

Kolfman et al., "Sony Enters Polarization Imaging Market", News and Discussion About Image Sensors, Feb. 2, 2018, 8 pages, Image Sensors World.

Lynred USA, "Snake SW", Snake SW Datasheet, Jan. 6, 2020, 2 pages, Lynred USA, Fairfield, NJ, United States of America.

Lynred USA, "Snake SW Tecless", Snake SW Tecless Datasheet, Jan. 6, 2020, 2 pages, Lynred USA, Fairfield, NJ, United States of America.

Gruev et al., "CCD Polarization Imaging Sensor with Aluminum Nanowire Optical Filters", Optics Express, Aug. 24, 2010, 8 pages, vol. 18—No. 18, Optical Society of America, St. Louis, MO, United States of America.

Raptor Photonics, "Owl 640 II", Specification for Owl 640 II, 2021, 2 pages, Raptor Photonics Inc. (USA), United States of America.

* cited by examiner

IMAGER OPTICAL SYSTEMS AND METHODS

CROSS-REFERENCE TO RELATED APPLICATIONS

This patent application is a U.S. National Stage Patent Application under 35 U.S.C. 371 of International Patent Application No. PCT/US2020/016261, filed Jan. 31, 2020 and entitled "IMAGER OPTICAL SYSTEMS AND METHODS," which claims priority to and the benefit of U.S. Provisional Patent Application No. 62/801,024 filed Feb. 4, 2019 and entitled "STRAY LIGHT SHIELD SYSTEMS AND METHODS" and U.S. Provisional Patent Application No. 62/833,606 filed Apr. 12, 2019 and entitled "IMAGER OPTICAL SYSTEMS AND METHODS," each of which is incorporated herein by reference in its entirety.

TECHNICAL FIELD

One or more embodiments relate generally to imaging systems and more particularly, for example, to optical systems, methods, and related imager techniques.

BACKGROUND

Imaging systems may include an array of detectors, with each detector functioning as a pixel to produce a portion of a two-dimensional image. There are a wide variety of image detectors, such as visible-light image detectors, infrared image detectors, or other types of image detectors that may be provided in an image detector array for capturing an image. As an example, a plurality of sensors may be provided in an image detector array to detect electromagnetic (EM) radiation at desired wavelengths. In some cases, such as for infrared imaging, readout of image data captured by the detectors may be performed in a time-multiplexed manner by a readout integrated circuit (ROIC). The image data that is read out may be communicated to other circuitry, such as for processing, storage, and/or display. In some cases, a combination of a detector array and an ROIC may be referred to as a focal plane array (FPA). Advances in process technology for FPAs and image processing have led to increased capabilities and sophistication of resulting imaging systems.

SUMMARY

In one or more embodiments, an imaging system includes a focal plane array and an alignment frame. The focal plane array includes a detector array configured to detect a first portion of electromagnetic radiation and generate a detector signal based on the first portion. The focal plane array further includes a readout circuit coupled to the detector array and configured to receive the detector signal. The alignment frame is coupled to the FPA and configured to align an optical element for filtering the first portion of electromagnetic radiation as the first portion approaches the detector array.

In one or more embodiments, an imaging system includes a focal plane array and a light shield. The focal plane array includes a detector array configured to detect a first portion of electromagnetic radiation and generate a detector signal based on the first portion. The focal plane array further includes a readout circuit coupled to the detector array and configured to receive the detector signal. The light shield is coupled to the FPA and configured to block a second portion of the electromagnetic radiation.

In one or more embodiments, for a method of manufacturing the imaging system, the method includes providing the focal plane array, and coupling the light shield to the focal plane array such that interior surfaces of a portion of the light shield faces exterior surfaces of the detector array of the focal plane array.

In one or more embodiments, a method includes detecting, by a focal plane array that comprises a detector array and a readout circuit, a first portion of electromagnetic radiation. The method further includes generating, by the focal plane array, a detector signal based on the first portion. The method further includes blocking, by a first light shield coupled to the focal plane array, a second portion of the electromagnetic radiation from the detector array by absorbing the second portion.

In one or more embodiments, a device includes an alignment frame. The alignment frame is configured to couple to a focal plane array. The alignment frame includes a leg configured to couple to the focal plane array. The alignment frame further includes a wall extending from the leg. The alignment frame further includes at least one alignment element extending from the wall and configured to align an optical element with a detector array of the focal plane array.

In one or more embodiments, an alignment frame may be configured to align an optical element with a detector array. In some embodiments, the alignment frame does not include stray light blocking features associated with a light shield. In other embodiments, the alignment frame may include such blocking features associated with a light shield.

In one or more embodiments, a light shield may be configured to block a portion of electromagnetic radiation. In some embodiments, the light shield does not include alignment features associated with an alignment frame. In other embodiments, the light shield may include such alignment features to receive an optical element and align the optical element relative to a focal plane array (e.g., a detector array of the focal plane array).

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1:
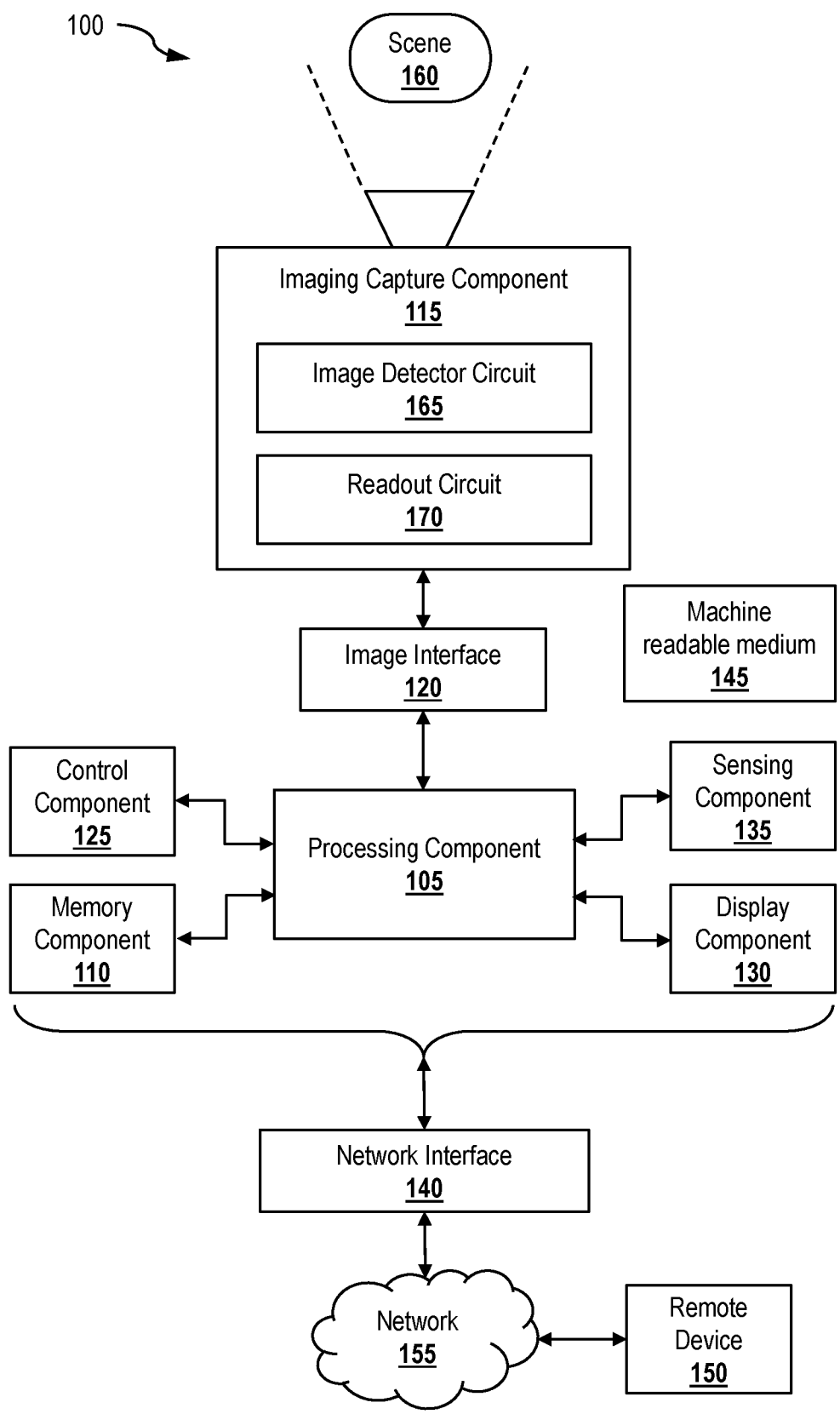
FIG. 1 illustrates a block diagram of an example imaging system in accordance with one or more embodiments of the present disclosure.

Embodiments of the present disclosure and their advantages are best understood by referring to the detailed description that follows. It is noted that sizes of various components and distances between these components are not drawn to scale in the figures. It should be appreciated that like reference numerals are used to identify like elements illustrated in one or more of the figures.

DETAILED DESCRIPTION

The detailed description set forth below is intended as a description of various configurations of the subject technology and is not intended to represent the only configurations in which the subject technology can be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more embodiments. In one or more instances, structures and components are shown in block diagram form in order to avoid obscuring the concepts of the subject technology. One or more embodiments of the subject disclosure are illustrated by and/or described in connection with one or more figures and are set forth in the claims. It is noted that sizes of various components are not necessarily drawn to scale in the drawings.

In some embodiments, an imaging device including an alignment frame and an optical element coupled to the alignment frame is provided to filter light and provide the filtered light to a detector circuit (e.g., a detector array). The alignment frame may include alignment elements that extend from a wall of the alignment frame and are configured to align the optical element with the detector circuit. For example, the optical element may be aligned with the detector circuit according to the alignment elements and coupled to a surface of the alignment frame. In some cases, the optical element may be aligned precisely with, and positioned in close proximity to, an active area of the detector circuit (e.g., a detector array, a focal plane array). In an aspect, the optical element may be used to filter electromagnetic radiation of a waveband(s) of interest as the electromagnetic radiation approaches the active area of the focal plane array. For example, the optical element may be a polarizer, Bayer pattern, or other type of filter or lens suitable for a given application. Providing the optical element in close proximity to the active area of the focal plane array without intervening components of the imaging device may improve alignment tolerances associated with the imaging device. For example, various embodiments include pixel-level alignment of patterns on filter elements.

In some embodiments, an imaging device including a light shield is provided for blocking stray light from reaching a detector circuit (e.g., a detector array). In some aspects, the imaging device may be used in an enclosed vacuum package, an open frame package, or other package. The light shield may surround or substantially surround the detector circuit to block stray light from impinging certain surfaces and edges of the detector circuit without impeding a desired light signal from reaching the detector circuit. For example, such stray light may strike edges of a substrate of the detector circuit. In cases that the substrate is transmissive to the stray light, the stray light that strikes the edges of the substrate may bend (e.g., refract) via Snell's law into an active area of the detector circuit. The stray light captured by the detector circuit generally results in undesirable effects in captured images, such as artifacts, noise, and distortion. In an aspect, an optical element may be coupled to the light shield to filter light and provide the filtered light to the detector circuit. In some cases of such an aspect, the light shield may include alignment elements to receive (e.g., support, hold, secure) the optical element and align the optical element with the detector circuit as appropriate for a given application.

In some aspects, an alignment frame may be utilized as a light shield. In this regard, such a light shield may be utilized to block stray light from reaching the detector circuit, while also having alignment elements (e.g., extending from a wall of the light shield) appropriate to receive an optical element, align the optical element relative to the detector circuit, filter light, and provide the filtered light to the detector circuit. In other aspects, an alignment frame may be utilized primarily to receive and align an optical element and might not include stray light blocking characteristics associated with a light shield.

A material utilized to form the light shield may be based on a desired application. In some embodiments, the light shield may be utilized to mitigate stray light by absorbing the stray light and thus prevent the stray light from reaching the detector circuit. The light shield may be made from a material that absorbs light in a waveband(s) of interest. In some cases, the material may be compatible with a high-vacuum environment. As an example, for infrared imaging applications, the material may be black aluminum oxide.

In some aspects, the imaging device may include a baffle positioned over the detector circuit that can be utilized in tandem with the light shield. Positioning of the baffle is generally associated with tradeoffs. The baffle generally blocks more stray light as a distance between the baffle and the detector circuit is decreased. As this distance decreases, a shadow over the detector circuit (e.g., over the active area of the detector circuit) formed by the baffle may increase in size, which generally adversely affects capturing of image data by the detector circuit. Thus, in utilizing both the baffle and the light shield, the baffle may be positioned over the detector array to block stray light while avoiding formation of a shadow over the detector circuit. Residual stray light that may pass the baffle due to the baffle being positioned farther from the detector circuit (e.g., to avoid formation of a shadow) may be mitigated by the light shield, which may block (e.g., via absorption) the residual stray light that passes the baffle and/or other stray light. In some cases, an alignment frame may be utilized as a light shield.

Thus, using various embodiments, the light shield may block stray light that would have been transmitted through the substrate of the detector circuit if the light shield were not present. In some cases, the light shield may be utilized to prevent stray light that has wavelength components within a waveband(s) of interest from reaching the active area of the detector circuit, such as in cases that the substrate of the detector has a transmission in the waveband(s) of interest. A waveband of interest may refer to a portion of EM radiation being detected for by the detector circuit. As such, blocking of such stray light mitigates contribution to captured image data due to the stray light.

Referring now to the drawings, FIG. 1 illustrates a block diagram of an example imaging system 100 (e.g., an infrared camera) in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided.

The imaging system 100 may be utilized for capturing and processing images in accordance with an embodiment of the disclosure. The imaging system 100 may represent any type of imaging system that detects one or more ranges (e.g., wavebands) of EM radiation and provides representative data (e.g., one or more still image frames or video image frames). The imaging system 100 may include a housing that at least partially encloses components of the imaging system 100, such as to facilitate compactness and protection of the imaging system 100. For example, the solid box labeled 100 in FIG. 1 may represent the housing of the imaging system 100. The housing may contain more, fewer, and/or different components of the imaging system 100 than those depicted within the solid box in FIG. 1. In an embodiment, the imaging system 100 may include a portable device and may be incorporated, for example, into a vehicle or a non-mobile installation requiring images to be stored and/or displayed. The vehicle may be a land-based vehicle (e.g., automobile), a naval-based vehicle, an aerial vehicle (e.g., unmanned aerial vehicle (UAV)), a space vehicle, or generally any type of vehicle that may incorporate (e.g., installed within, mounted thereon, etc.) the imaging system 100. In another example, the imaging system 100 may be coupled to various types of fixed locations (e.g., a home security mount, a campsite or outdoors mount, or other location) via one or more types of mounts.

The imaging system 100 includes, according to one implementation, a processing component 105, a memory component 110, an image capture component 115, an image interface 120, a control component 125, a display component 130, a sensing component 135, and/or a network interface 140. The processing component 105, according to various embodiments, includes one or more of a processor, a microprocessor, a central processing unit (CPU), a graphics processing unit (GPU), a single-core processor, a multi-core processor, a microcontroller, a programmable logic device (PLD) (e.g., field programmable gate array (FPGA)), an application specific integrated circuit (ASIC), a digital signal processing (DSP) device, or other logic device that may be configured, by hardwiring, executing software instructions, or a combination of both, to perform various operations discussed herein for embodiments of the disclosure. The processing component 105 may be configured to interface and communicate with the various other components (e.g., 110, 115, 120, 125, 130, 135, etc.) of the imaging system 100 to perform such operations. For example, the processing component 105 may be configured to process captured image data received from the image capture component 115, store the image data in the memory component 110, and/or retrieve stored image data from the memory component 110. In one aspect, the processing component 105 may be configured to perform various system control operations (e.g., to control communications and operations of various components of the imaging system 100) and other image processing operations (e.g., data conversion, video analytics, etc.).

The memory component 110 includes, in one embodiment, one or more memory devices configured to store data and information, including infrared image data and information. The memory component 110 may include one or more various types of memory devices including volatile and non-volatile memory devices, such as random access memory (RAM), dynamic RAM (DRAM), static RAM (SRAM), non-volatile random-access memory (NVRAM), read-only memory (ROM), programmable read-only memory (PROM), erasable programmable read-only memory (EPROM), electrically-erasable programmable read-only memory (EEPROM), flash memory, hard disk drive, and/or other types of memory. As discussed above, the processing component 105 may be configured to execute software instructions stored in the memory component 110 so as to perform method and process steps and/or operations. The processing component 105 and/or the image interface 120 may be configured to store in the memory component 110 images or digital image data captured by the image capture component 115. The processing component 105 may be configured to store processed still and/or video images in the memory component 110.

In some embodiments, a separate machine-readable medium 145 (e.g., a memory, such as a hard drive, a compact disk, a digital video disk, or a flash memory) may store the software instructions and/or configuration data which can be executed or accessed by a computer (e.g., a logic device or processor-based system) to perform various methods and operations, such as methods and operations associated with processing image data. In one aspect, the machine-readable medium 145 may be portable and/or located separate from the imaging system 100, with the stored software instructions and/or data provided to the imaging system 100 by coupling the machine-readable medium 145 to the imaging system 100 and/or by the imaging system 100 downloading (e.g., via a wired link and/or a wireless link) from the machine-readable medium 145. It should be appreciated that various modules may be integrated in software and/or hardware as part of the processing component 105, with code (e.g., software or configuration data) for the modules stored, for example, in the memory component 110.

The imaging system 100 may represent an imaging device, such as a video and/or still camera, to capture and process images and/or videos of a scene 160. In this regard, the image capture component 115 of the imaging system 100 may be configured to capture images (e.g., still and/or video images) of the scene 160 in a particular spectrum or modality. The image capture component 115 includes an image detector circuit 165 (e.g., a thermal infrared detector circuit) and a readout circuit 170 (e.g., an ROIC). For example, the image capture component 115 may include an IR imaging sensor (e.g., IR imaging sensor array) configured to detect IR radiation in the near, middle, and/or far IR spectrum and provide IR images (e.g., IR image data or signal) representative of the IR radiation from the scene 160. For example, the image detector circuit 165 may capture (e.g., detect, sense) IR radiation with wavelengths in the range from around 700 nm to around 2 mm, or portion thereof. For example, in some aspects, the image detector circuit 165 may be sensitive to (e.g., better detect) short-wave IR (SWIR) radiation, mid-wave IR (MWIR) radiation (e.g., EM radiation with wavelength of 2-5 µm) and/or long-wave IR (LWIR) radiation (e.g., EM radiation with wavelength of 7-14 µm), or any desired IR wavelengths (e.g., generally in the 0.7 to 14 µm range). In other aspects, the image detector circuit 165 may capture radiation from one or more other wavebands of the EM spectrum, such as visible-light, ultraviolet light, and so forth.

The image detector circuit 165 may capture image data associated with the scene 160. To capture the image, the image detector circuit 165 may detect image data of the scene 160 (e.g., in the form of EM radiation) and generate pixel values of the image based on the scene 160. An image may be referred to as a frame or an image frame. In some cases, the image detector circuit 165 may include an array of detectors (e.g., also referred to as an array of pixels) that can detect radiation of a certain waveband, convert the detected radiation into electrical signals (e.g., voltages, currents, etc.), and generate the pixel values based on the electrical signals. Each detector in the array may capture a respective portion of the image data and generate a pixel value based on the respective portion captured by the detector. In an aspect, each detector has an active area for capturing the respective portion of the image data. A non-active area of a detector may refer to any portion of the detector that is not the active area. The pixel value generated by the detector may be referred to as an output of the detector. By way of non-limiting example, each detector may be a photodetector, such as an avalanche photodiode, an infrared photodetector, a quantum well infrared photodetector, a microbolometer, or other detector capable of converting EM radiation (e.g., of a certain wavelength) to a pixel value. The array of detectors may be arranged in rows and columns. Although the present disclosure generally refers to various operations performed on rows and/or columns, rows may be used as columns and columns may be used as rows as appropriate.

In an aspect, the imaging system 100 (e.g., the image capture component 115 of the imaging system 100) may include one or more optical elements (e.g., mirrors, lenses, beamsplitters, beam couplers, etc.) to direct EM radiation to the image detector circuit 165. In some cases, an optical element may be at least partially within the housing of the imaging system 100. In some embodiments, a light shield is provided within the housing of the imaging system 100 to block stray EM radiation (e.g., also referred to as stray light) from being captured by the image detector circuit 165. In an aspect, the light shield is coupled to a surface of the readout circuit 170. For example, the light shield may prevent stray light from being bent (e.g., refracted) by a detector substrate (e.g., an edge of a detector substrate) and directed to an active area of the image detector circuit 165.

The image may be, or may be considered, a data structure that includes pixels and is a representation of the image data associated with the scene 160, with each pixel having a pixel value that represents EM radiation emitted or reflected from a portion of the scene and received by a detector that generates the pixel value. Based on context, a pixel may refer to a detector of the image detector circuit 165 that generates an associated pixel value or a pixel (e.g., pixel location, pixel coordinate) of the image formed from the generated pixel values.

In an embodiment, the pixel values generated by the image detector circuit 165 may be represented in terms of digital count values generated based on the electrical signals obtained from converting the detected radiation. For example, in a case that the image detector circuit 165 includes or is otherwise coupled to an ADC circuit, the ADC circuit may generate digital count values based on the electrical signals. For an ADC circuit that can represent an electrical signal using 14 bits, the digital count value may range from 0 to 16,383. In such cases, the pixel value of the detector may be the digital count value output from the ADC circuit. In other cases (e.g., in cases without an ADC circuit), the pixel value may be analog in nature with a value that is, or is indicative of, the value of the electrical signal. As an example, for infrared imaging, a larger amount of IR radiation being incident on and detected by the image detector circuit 165 (e.g., an IR image detector circuit) is associated with higher digital count values and higher temperatures.

The readout circuit 170 may be utilized as an interface between the image detector circuit 165 that detects the image data and the processing component 105 that processes the detected image data as read out by the readout circuit 170, with communication of data from the readout circuit 170 to the processing component 105 facilitated by the image interface 120. An image capturing frame rate may refer to the rate (e.g., images per second) at which images are detected in a sequence by the image detector circuit 165 and provided to the processing component 105 by the readout circuit 170. The readout circuit 170 may read out the pixel values generated by the image detector circuit 165 in accordance with an integration time (e.g., also referred to as an integration period). In some cases, ADC circuits to generate digital count values for detectors of the image detector circuit 165 may be implemented as part of the image detector circuit 165. In other cases, such ADC circuits may be implemented as part of the readout circuit 170.

In various embodiments, a combination of the image detector circuit 165 and the readout circuit 170 may be, may include, or may together provide an FPA. In some aspects, the image detector circuit 165 may be a thermal image detector circuit that includes an array of microbolometers, and the combination of the image detector circuit 165 and the readout circuit 170 may be referred to as a microbolometer FPA. In some cases, the array of microbolometers may be arranged in rows and columns. The microbolometers may detect IR radiation and generate pixel values based on the detected IR radiation. For example, in some cases, the microbolometers may be thermal IR detectors that detect IR radiation in the form of heat energy and generate pixel values based on the amount of heat energy detected. The microbolometer FPA may include IR detecting materials such as amorphous silicon (a-Si), vanadium oxide ($VO_x$), a combination thereof, and/or other detecting material(s). In an aspect, for a microbolometer FPA, the integration time may be, or may be indicative of, a time interval during which the microbolometers are biased. In this case, a longer integration time may be associated with higher gain of the IR signal, but not more IR radiation being collected. The IR radiation may be collected in the form of heat energy by the microbolometers.

In some cases, the image capture component 115 may include one or more filters adapted to pass radiation of some wavelengths but substantially block radiation of other wavelengths. For example, the image capture component 115 may be an IR imaging device that includes one or more filters adapted to pass IR radiation of some wavelengths while substantially blocking IR radiation of other wavelengths (e.g., MWIR filters, thermal IR filters, and narrow-band filters). In this example, such filters may be utilized to tailor the image capture component 115 for increased sensitivity to a desired band of IR wavelengths. In an aspect, an IR imaging device may be referred to as a thermal imaging device when the IR imaging device is tailored for capturing thermal IR images. Other imaging devices, including IR imaging devices tailored for capturing infrared IR images outside the thermal range, may be referred to as non-thermal imaging devices.

In one specific, not-limiting example, the image capture component 115 may comprise an IR imaging sensor having an FPA of detectors responsive to IR radiation including near infrared (NIR), SWIR, MWIR, LWIR, and/or very-long wave IR (VLWIR) radiation. In some other embodiments, alternatively or in addition, the image capture component 115 may include a complementary metal oxide semiconductor (CMOS) sensor or a charge-coupled device (CCD) sensor that can be found in any consumer camera (e.g., visible light camera).

Other imaging sensors that may be embodied in the image capture component 115 include a photonic mixer device (PMD) imaging sensor or other time of flight (ToF) imaging sensor, light detection and ranging (LIDAR) imaging device, millimeter imaging device, positron emission tomography (PET) scanner, single photon emission computed tomography (SPECT) scanner, ultrasonic imaging device, or other imaging devices operating in particular modalities and/or spectra. It is noted that for some of these imaging sensors that are configured to capture images in particular modalities and/or spectra (e.g., infrared spectrum, etc.), they are more prone to produce images with low frequency shading, for example, when compared with a typical CMOS-based or CCD-based imaging sensors or other imaging sensors, imaging scanners, or imaging devices of different modalities.

The images, or the digital image data corresponding to the images, provided by the image capture component 115 may be associated with respective image dimensions (also referred to as pixel dimensions). An image dimension, or pixel dimension, generally refers to the number of pixels in an image, which may be expressed, for example, in width multiplied by height for two-dimensional images or otherwise appropriate for relevant dimension or shape of the image. Thus, images having a native resolution may be resized to a smaller size (e.g., having smaller pixel dimensions) in order to, for example, reduce the cost of processing and analyzing the images. Filters (e.g., a non-uniformity estimate) may be generated based on an analysis of the resized images. The filters may then be resized to the native resolution and dimensions of the images, before being applied to the images.

The image interface 120 may include, in some embodiments, appropriate input ports, connectors, switches, and/or circuitry configured to interface with external devices (e.g., a remote device 150 and/or other devices) to receive images (e.g., digital image data) generated by or otherwise stored at the external devices. The received images or image data may be provided to the processing component 105. In this regard, the received images or image data may be converted into signals or data suitable for processing by the processing component 105. For example, in one embodiment, the image interface 120 may be configured to receive analog video data and convert it into suitable digital data to be provided to the processing component 105.

In some embodiments, the image interface 120 may include various standard video ports, which may be connected to a video player, a video camera, or other devices capable of generating standard video signals, and may convert the received video signals into digital video/image data suitable for processing by the processing component 105. In some embodiments, the image interface 120 may also be configured to interface with and receive images (e.g., image data) from the image capture component 115. In other embodiments, the image capture component 115 may interface directly with the processing component 105.

The control component 125 includes, in one embodiment, a user input and/or an interface device, such as a rotatable knob (e.g., potentiometer), push buttons, slide bar, keyboard, and/or other devices, that is adapted to generate a user input control signal. The processing component 105 may be configured to sense control input signals from a user via the control component 125 and respond to any sensed control input signals received therefrom. The processing component 105 may be configured to interpret such a control input signal as a value, as generally understood by one skilled in the art. In one embodiment, the control component 125 may include a control unit (e.g., a wired or wireless handheld control unit) having push buttons adapted to interface with a user and receive user input control values. In one implementation, the push buttons of the control unit may be used to control various functions of the imaging system 100, such as autofocus, menu enable and selection, field of view, brightness, contrast, noise filtering, image enhancement, and/or various other features of an imaging system or camera.

The display component 130 includes, in one embodiment, an image display device (e.g., a liquid crystal display (LCD)) or various other types of generally known video displays or monitors. The processing component 105 may be configured to display image data and information on the display component 130. The processing component 105 may be configured to retrieve image data and information from the memory component 110 and display any retrieved image data and information on the display component 130. The display component 130 may include display circuitry, which may be utilized by the processing component 105 to display image data and information. The display component 130 may be adapted to receive image data and information directly from the image capture component 115, processing component 105, and/or image interface 120, or the image data and information may be transferred from the memory component 110 via the processing component 105.

The sensing component 135 includes, in one embodiment, one or more sensors of various types, depending on the application or implementation requirements, as would be understood by one skilled in the art. Sensors of the sensing component 135 provide data and/or information to at least the processing component 105. In one aspect, the processing component 105 may be configured to communicate with the sensing component 135. In various implementations, the sensing component 135 may provide information regarding environmental conditions, such as outside temperature, lighting conditions (e.g., day, night, dusk, and/or dawn), humidity level, specific weather conditions (e.g., sun, rain, and/or snow), distance (e.g., laser rangefinder or time-of-flight camera), and/or whether a tunnel or other type of enclosure has been entered or exited. The sensing component 135 may represent conventional sensors as generally known by one skilled in the art for monitoring various conditions (e.g., environmental conditions) that may have an effect (e.g., on the image appearance) on the image data provided by the image capture component 115.

In some implementations, the sensing component 135 (e.g., one or more sensors) may include devices that relay information to the processing component 105 via wired and/or wireless communication. For example, the sensing component 135 may be adapted to receive information from a satellite, through a local broadcast (e.g., radio frequency (RF)) transmission, through a mobile or cellular network and/or through information beacons in an infrastructure (e.g., a transportation or highway information beacon infrastructure), or various other wired and/or wireless techniques. In some embodiments, the processing component 105 can use the information (e.g., sensing data) retrieved from the sensing component 135 to modify a configuration of the image capture component 115 (e.g., adjusting a light sensitivity level, adjusting a direction or angle of the image capture component 115, adjusting an aperture, etc.).

In some embodiments, various components of the imaging system 100 may be distributed and in communication with one another over a network 155. In this regard, the imaging system 100 may include the network interface 140 configured to facilitate wired and/or wireless communication among various components of the imaging system 100 over the network 155. In such embodiments, components may also be replicated if desired for particular applications of the imaging system 100. That is, components configured for same or similar operations may be distributed over a network. Further, all or part of any one of the various components may be implemented using appropriate components of the remote device 150 (e.g., a conventional digital video recorder (DVR), a computer configured for image processing, and/or other device) in communication with various components of the imaging system 100 via the network interface 140 over the network 155, if desired. Thus, for example, all or part of the processing component 105, all or part of the memory component 110, and/or all of part of the display component 130 may be implemented or replicated at the remote device 150. In some embodiments, the imaging system 100 may not include imaging sensors (e.g., image capture component 115), but instead receive images or image data from imaging sensors located separately and remotely from the processing component 105 and/or other components of the imaging system 100. It will be appreciated that many other combinations of distributed implementations of the imaging system 100 are possible, without departing from the scope and spirit of the disclosure.

Furthermore, in various embodiments, various components of the imaging system 100 may be combined and/or implemented or not, as desired or depending on the application or requirements. In one example, the processing component 105 may be combined with the memory component 110, the image capture component 115, the image interface 120, the display component 130, the sensing component 135, and/or the network interface 140. In another example, the processing component 105 may be combined with the image capture component 115, such that certain functions of processing component 105 are performed by circuitry (e.g., a processor, a microprocessor, a logic device, a microcontroller, etc.) within the image capture component 115.

Figure 2A:
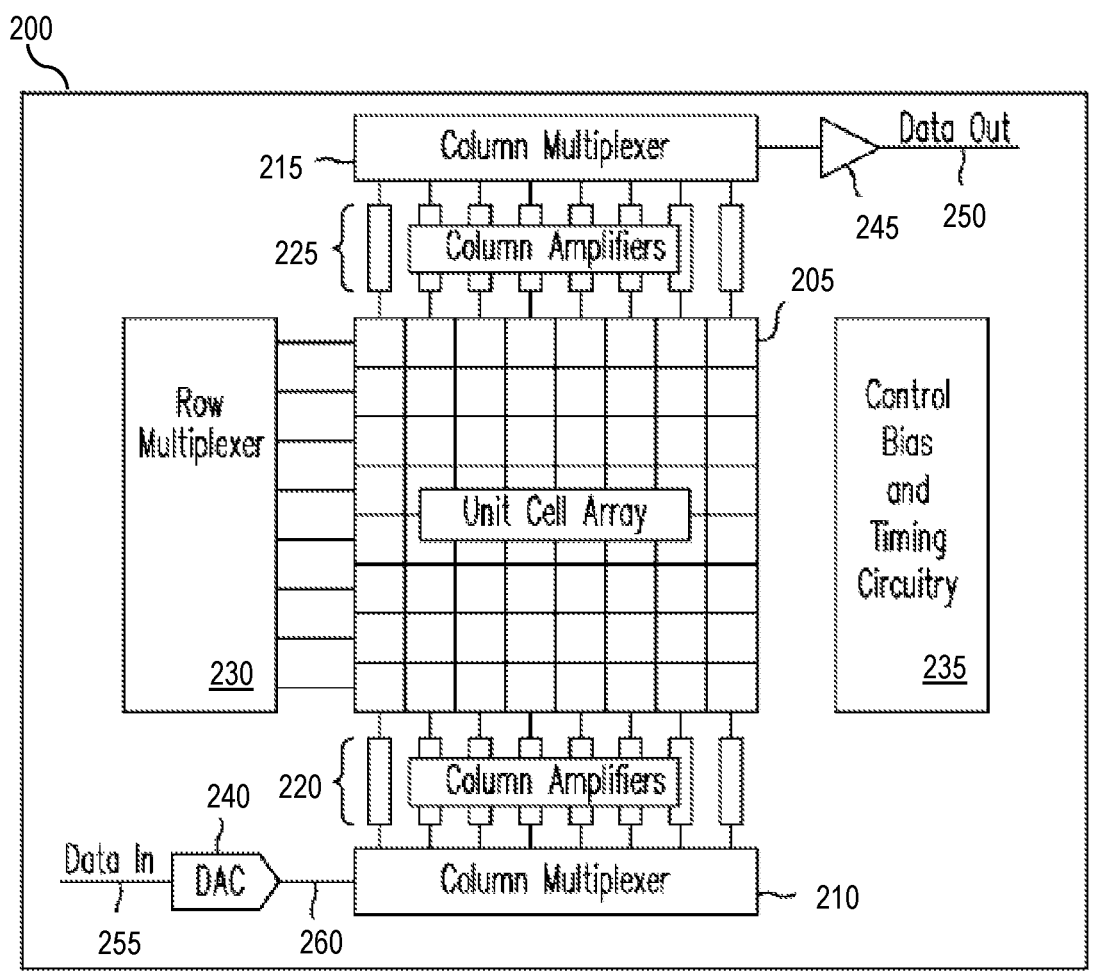
FIG. 2A illustrates a block diagram of an example image sensor assembly in accordance with one or more embodiments of the present disclosure.

FIG. 2A illustrates a block diagram of an example image sensor assembly 200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 200 may be an FPA, for example, implemented as the image capture component 115 of FIG. 1.

The image sensor assembly 200 includes a unit cell array 205, column multiplexers 210 and 215, column amplifiers 220 and 225, a row multiplexer 230, control bias and timing circuitry 235, a digital-to-analog converter (DAC) 240, and a data output buffer 245. The unit cell array 205 includes an array of unit cells. In an aspect, each unit cell may include a detector and interface circuitry. The interface circuitry of each unit cell may provide an output signal, such as an output voltage or an output current, in response to a detector signal (e.g., detector current, detector voltage) provided by the detector of the unit cell. The output signal may be indicative of the magnitude of EM radiation received by the detector. The column multiplexer 215, the column amplifiers 220, the row multiplexer 230, and the data output buffer 245 may be used to provide the output signals from the unit cell array 205 as a data output signal on a data output line 250. The output signals on the data output line 250 may be provided to components downstream of the image sensor assembly 200, such as processing circuitry (e.g., the processing component 105 of FIG. 1), memory (e.g., the memory component 110 of FIG. 1), display device (e.g., the display component 130 of FIG. 1), and/or other component to facilitate processing, storage, and/or display of the output signals. The data output signal may be an image formed of the pixel values for the image sensor assembly 200. In this regard, the column multiplexer 215, the column amplifiers 220, the row multiplexer 230, and the data output buffer 245 may collectively provide an ROIC (or portion thereof) of the image sensor assembly 200.

The column amplifiers 225 may generally represent any column processing circuitry as appropriate for a given application (analog and/or digital), and is not limited to amplifier circuitry for analog signals. In this regard, the column amplifiers 225 may more generally be referred to as column processors in such an aspect. Signals received by the column amplifiers 225, such as analog signals on an analog bus and/or digital signals on a digital bus, may be processed according to the analog or digital nature of the signal. As an example, the column amplifiers 225 may include circuitry for processing digital signals. As another example, the column amplifiers 225 may be a path (e.g., no processing) through which digital signals from the unit cell array 205 traverses to get to the column multiplexer 215. As another example, the column amplifiers 225 may include an ADC for converting analog signals to digital signals (e.g., to obtain digital count values). These digital signals may be provided to the column multiplexer 215.

Each unit cell may receive a bias signal (e.g., bias voltage, bias current) to bias the detector of the unit cell to compensate for different response characteristics of the unit cell attributable to, for example, variations in temperature, manufacturing variances, and/or other factors. For example, the control bias and timing circuitry 235 may generate the bias signals and provide them to the unit cells. By providing appropriate bias signals to each unit cell, the unit cell array 205 may be effectively calibrated to provide accurate image data in response to light (e.g., IR light) incident on the detectors of the unit cells.

In an aspect, the control bias and timing circuitry 235 may generate bias values, timing control voltages, and switch control voltages. In some cases, the DAC 240 may convert the bias values received as, or as part of, data input signal on a data input signal line 255 into bias signals (e.g., analog signals on analog signal line(s) 260) that may be provided to individual unit cells through the operation of the column multiplexer 210, column amplifiers 220, and row multiplexer 230. In another aspect, the control bias and timing circuitry 235 may generate the bias signals (e.g., analog signals) and provide the bias signals to the unit cells without utilizing the DAC 240. In this regard, some implementations do not include the DAC 240, the data input signal line 255, and/or the analog signal line(s) 260. In an embodiment, the control bias and timing circuitry 235 may be, may include, may be a part of, or may otherwise be coupled to the processing component 105 and/or image capture component 115 of FIG. 1.

In an embodiment, the image sensor assembly 200 may be implemented as part of an imaging system (e.g., 100). In addition to the various components of the image sensor assembly 200, the imaging system may also include one or more processors, memories, logic, displays, interfaces, optics (e.g., lenses, mirrors, beamsplitters), and/or other components as may be appropriate in various implementations. In an aspect, the data output signal on the data output line 250 may be provided to the processors (not shown) for further processing. For example, the data output signal may be an image formed of the pixel values from the unit cells of the image sensor assembly 200. The processors may perform operations such as non-uniformity correction (NUC), spatial and/or temporal filtering, and/or other operations. The images (e.g., processed images) may be stored in memory (e.g., external to or local to the imaging system) and/or displayed on a display device (e.g., external to and/or integrated with the imaging system).

By way of non-limiting examples, the unit cell array 205 may include 512×512 (e.g., 512 rows and 512 columns of unit cells), 1024×1024, 2048×2048, 4096×4096, 8192×8192, and/or other array sizes. In some cases, the array size may have a row size (e.g., number of detectors in a row) different from a column size (e.g., number of detectors in a column). Examples of frame rates may include 30 Hz, 60 Hz, and 120 Hz. In an aspect, each unit cell of the unit cell array 205 may represent a pixel.

Figure 2B:
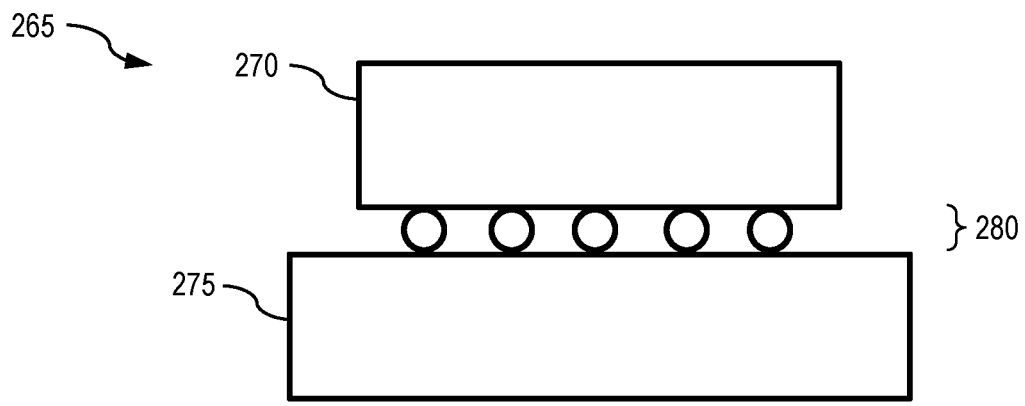
FIG. 2B illustrates an example image sensor assembly in accordance with one or more embodiments of the present disclosure.

In an embodiment, components of the image sensor assembly 200 may be implemented such that a detector array is hybridized to (e.g., bonded to) a readout circuit. For example, FIG. 2B illustrates an example image sensor assembly 265 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the image sensor assembly 265 may be, may include, or may be a part of, the image sensor assembly 200.

The image sensor assembly 265 includes a device wafer 270, a readout circuit 275, and contacts 280 to bond (e.g., mechanically and electrically bond) the device wafer 270 to the readout circuit 275. The device wafer 270 may include detectors (e.g., the unit cell array 205). The contacts 280 may bond the detectors of the device wafer 270 and the readout circuit 275. The contacts 280 may include conductive contacts of the detectors of the device wafer 270, conductive contacts of the readout circuit 275, and/or metallic bonds between the conductive contacts of the detectors and the conductive contacts of the readout circuit 275. For example, the contacts 280 may include contact layers formed on the detectors to facilitate coupling to the readout circuit 275. In one embodiment, the device wafer 270 may be bump-bonded to the readout circuit 275 using bonding bumps. The bonding bumps may be formed on the device wafer 270 and/or the readout circuit 275 to allow connection between the device wafer 270 and the readout circuit 275. In an aspect, hybridizing the device wafer 270 to the readout circuit 275 may refer to bonding the device wafer 270 (e.g., the detectors of the device wafer 270) to the readout circuit 275 to mechanically and electrically bond the device wafer 270 and the readout circuit 275. In an embodiment, a light shield may be coupled to a surface of the readout circuit 275 to block stray light from being captured by the detectors of the device wafer 270.

Figure 3A:
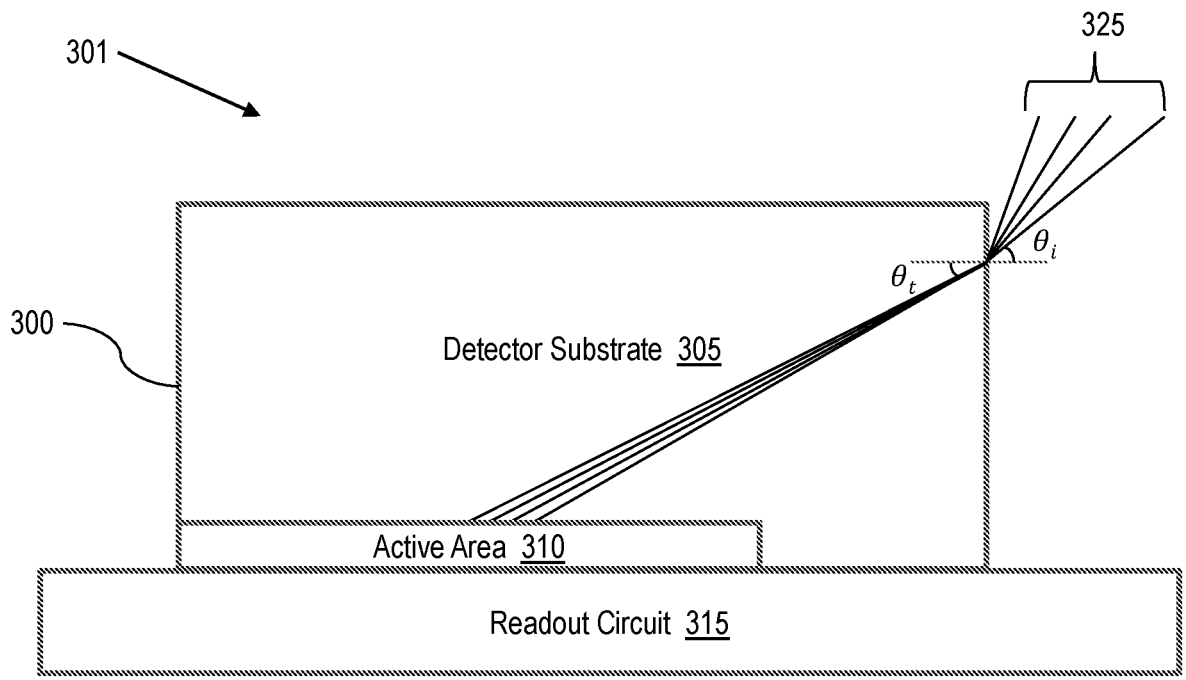
FIG. 3A illustrates an example imaging system that does not include a light shield.
Figure 3B:
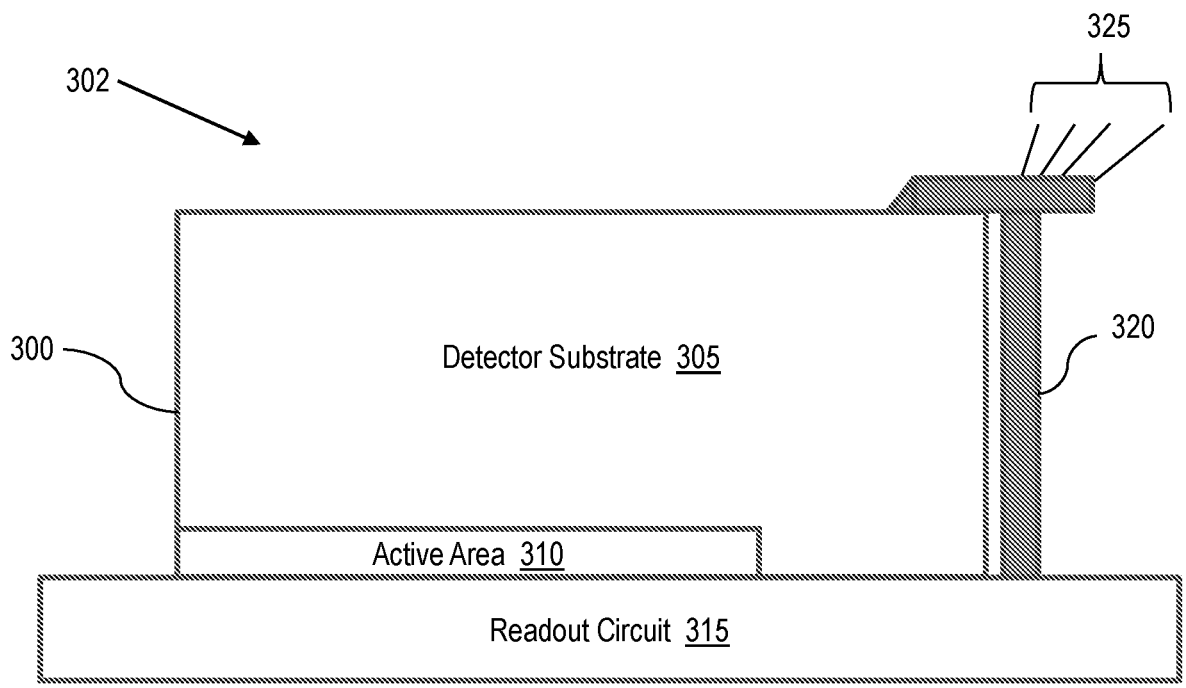
FIG. 3B illustrates an example imaging system with a light shield in accordance with one or more embodiments of the present disclosure.

FIG. 3A illustrates stray light 325 incident on an imaging system 301 that does not include a light shield. FIG. 3B illustrates the stray light 325 incident on an imaging system 302 that includes a light shield 320 in accordance with one or more embodiments of the present disclosure. Not all of the depicted components may be required, however, and one or more embodiments may include additional components shown in the figures. Variations in the arrangement and type of the components may be made without departing from the spirit or scope of the claims as set forth herein. Additional components, different components, and/or fewer components may be provided.

As shown in FIG. 3A, a detector substrate 305 of a detector array 300 may be made from transmissive semiconductor material(s) of a certain thickness and index of refraction. In some cases, a waveband of EM radiation that is being detected by the detector array 300 coincides with a waveband of EM radiation that the detector substrate 305 is capable of transmitting (e.g., traversing into and through the detector substrate 305). In this regard, as shown in FIG. 3A, the stray light 325 may be incident on an edge of the detector substrate 305, and bend (e.g., refract, transmit) via Snell's law into the detector substrate 305 and toward an active area 310 of the detector array 300. The stray light 325 incident on the active area 310 may result in undesirable effects in captured images (e.g., artifacts, noise, distortions, disturbances, etc.), which may be visible to a user viewing the images. An example of an incident angle and a transmission angle (e.g., also referred to as a refraction angle) is denoted as $\theta_i$ and $\theta_t$, respectively, in FIG. 3A. In some cases, the stray light 325 may include light that is not properly imaged through optics (e.g., a lens) of the imaging system 301 and the imaging system 302.

To block the stray light 325 from being captured by the active area 310 of the detector array 300, the imaging system 302 of FIG. 3B includes the light shield 320. In some cases, the imaging system 302 is identical to the imaging system 301 except with the addition of the light shield 320 in the imaging system 302. As shown in FIG. 3B, the light shield 320 may block certain surfaces and edges of the detector array 300. In some embodiments, the light shield 320 may block the stray light 325 by absorbing the stray light 325 and thus preventing the stray light 325 from reaching the detector array 300. In some embodiments, the light shield 320 may be utilized to mitigate stray light by absorbing the stray light. The stray light 325 incident on such surfaces and edges may be associated with light not properly imaged through optics (e.g., a lens) of the imaging system 302. In some cases, the stray light 325 may be residual stray light that passes (e.g., is left unscattered by) a baffle (not shown) of the imaging system 302.

A material utilized to form the light shield 320 may be based on a desired application. The light shield 320 may be made from a material that absorbs light in a waveband(s) of interest, such as to absorb stray light having wavelength components that coincide with a waveband(s) being detected for by the detector array 300. In some cases, the material may be compatible with a high-vacuum environment. As an example, for infrared imaging applications, the material may be black aluminum oxide. In this regard, by utilizing the light shield 320, the imaging system 302 allows light within a desired waveband(s) (e.g., SWIR, MWIR, and/or other wavebands) to reach the active area 310 (e.g., via optics of the imaging system 302) while blocking undesired light signals (e.g., including the stray light 325) from reaching the active area 310.

In an embodiment, the light shield 320 may be coupled to a readout circuit 315, as illustrated in FIG. 3B. In the example shown in FIG. 3B, the light shield 320 prevents the stray light 325 from entering the detector substrate 305 via an edge of the detector substrate 305 and thus preventing the stray light 325 from being refracted into the detector substrate 305 and reaching the active area 310. In an aspect, the light shield 320 may be coupled to the readout circuit 315 and the detector array 300. For example, in FIG. 3B, the light shield 320 is in contact with a surface of the readout circuit 315 and a surface of the detector array 300. The light shield 320 includes a triangular portion that slopes downward from a top surface of the light shield 320 to a top surface of the detector substrate 305. In another aspect, the light shield 320 is not in contact with the detector array 300. In an embodiment, the detector array 300 may be, may include, or may be a part of, the image detector circuit 165 of FIG. 1, and/or the readout circuit 315 may be, may include, or may be a part of, the readout circuit 170.

Although FIG. 3B illustrates the light shield 320 provided on a right side of the detector array 300, a light shield may be provided on a left side and/or other sides of the detector array 300. In an embodiment, a light shield may be provided to surround or substantially surround (e.g., form a perimeter around) the detector array 300, such that each edge of the detector substrate 305 has an associated portion of the light shield to facilitate blocking of stray light. In one example, the light shield may be an integrated structure formed from a material (e.g., machined or additive manufactured). In another example, the light shield may be formed by attaching together discrete components. Furthermore, while the light shield 320 of FIG. 3B has a T-shaped cross-section, the light shield 320 may have a cross-section of other shapes, such as an L-shaped cross-section.

Figure 4A:
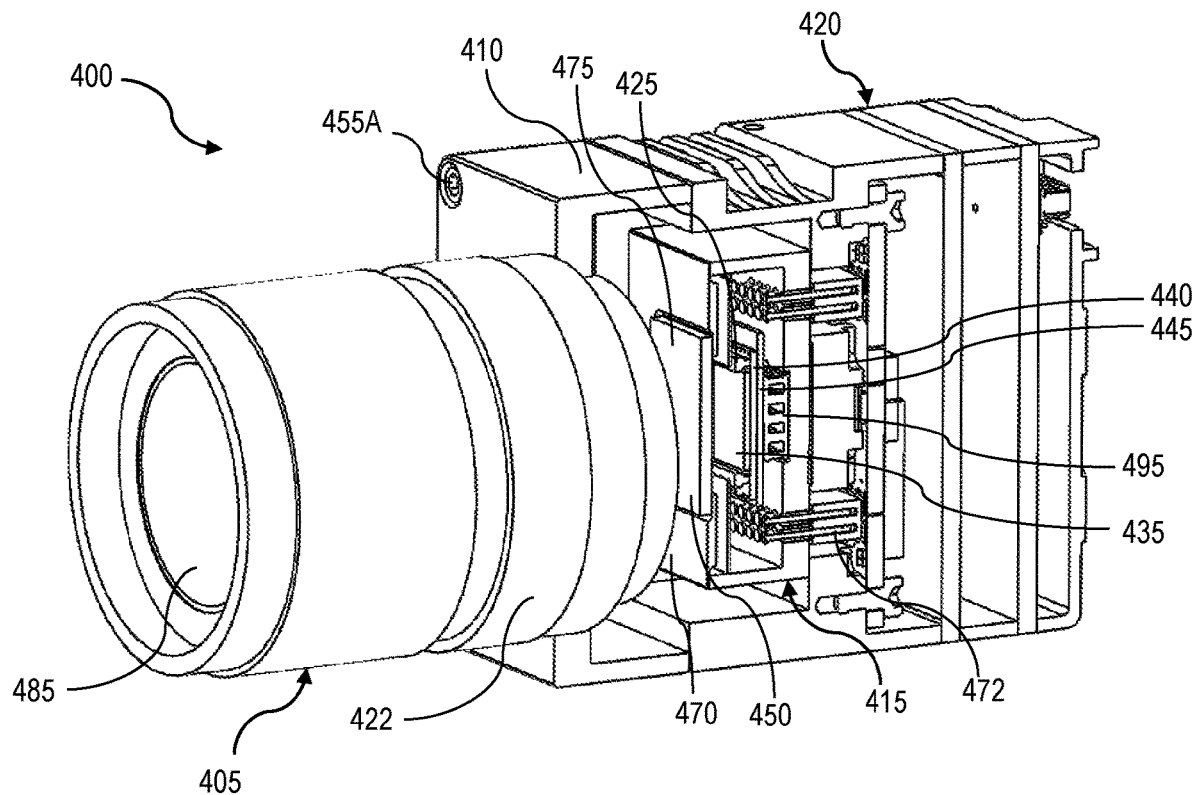
FIG. 4A illustrates a perspective sectional view of an imaging device in accordance with one or more embodiments of the present disclosure.
Figure 4B:
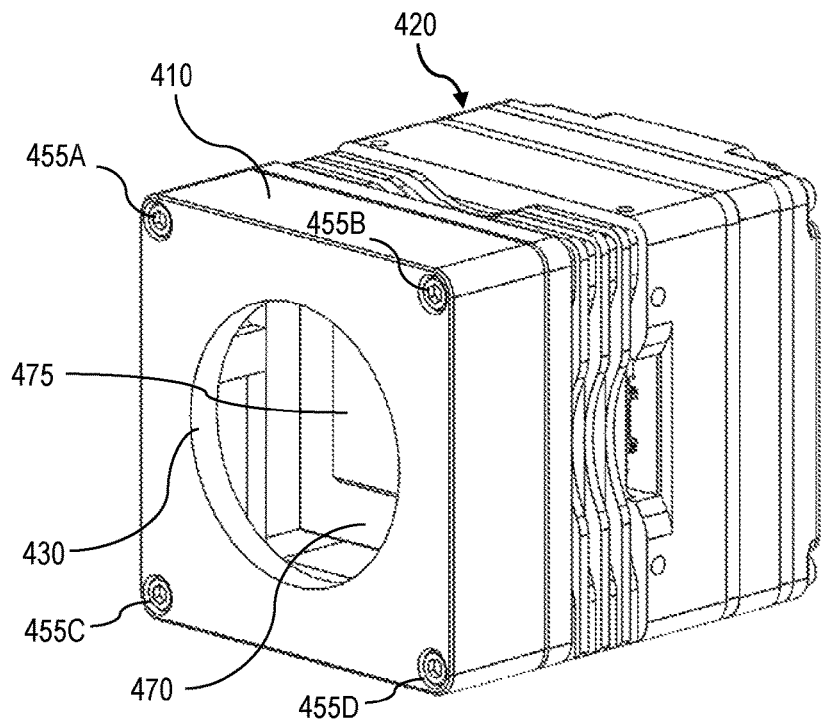
FIG. 4B illustrates the imaging device of FIG. 4A without depicting its lens assembly.
Figure 4C:
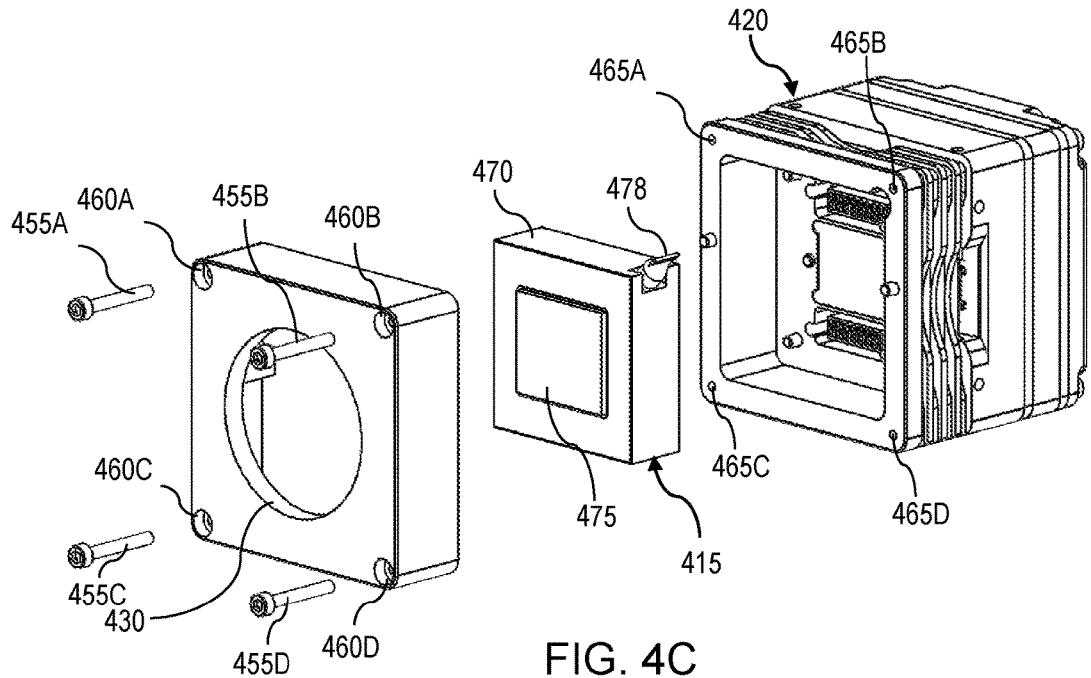
FIG. 4C illustrates an exploded view of the imaging device as depicted in FIG. 4B.
Figure 4D:
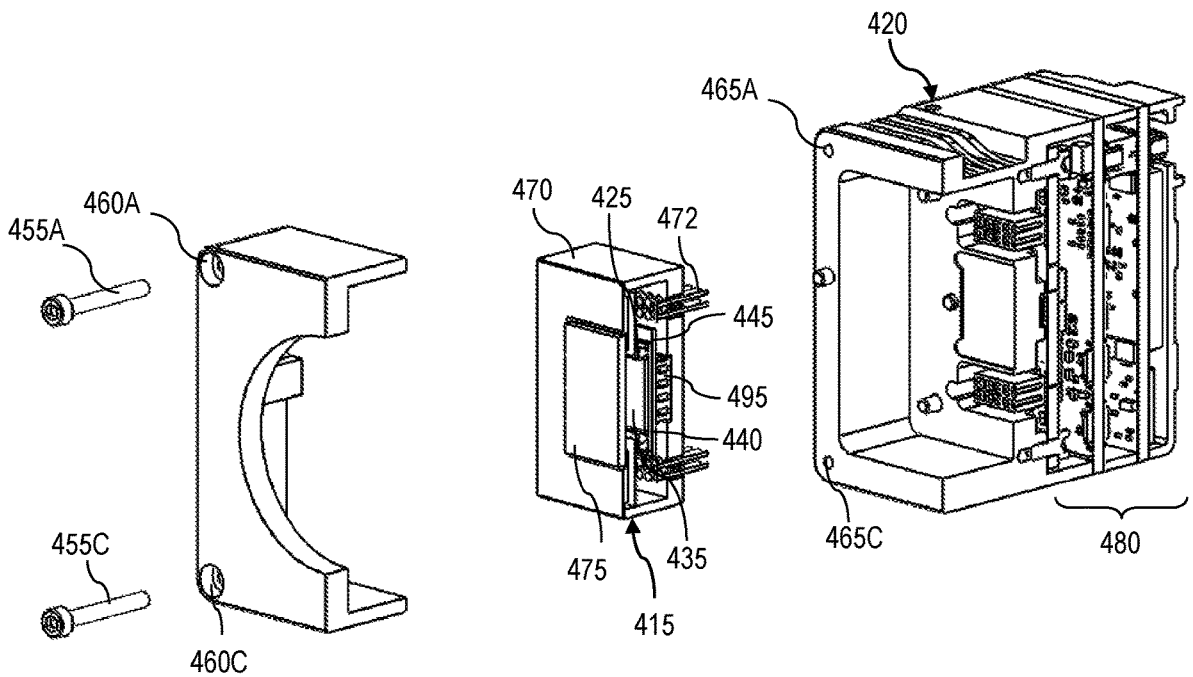
FIG. 4D illustrates a cross-section of the exploded view of FIG. 4C.

FIG. 4A illustrates an imaging device 400 in which a light shield 425 is implemented in accordance with one or more embodiments of the present disclosure. In particular, FIG. 4A illustrates a perspective sectional view of the imaging device 400. FIG. 4B illustrates the imaging device 400 of FIG. 4A without depicting a lens assembly 405 of the imaging device 400. FIG. 4C illustrates an exploded view of the imaging device 400 as depicted in FIG. 4B. FIG. 4D illustrates a cross-section of the exploded view of FIG. 4C. In some cases, the imaging device 400 may be implemented as the imaging system 100 of FIG. 1 or a portion thereof. For example, the imaging device 400 may be, may include, or may be a part of the image capture component 115 of FIG. 1. Not all of the depicted components may be required, however, and one or more embodiments may include additional components shown in the figures. Variations in the arrangement and type of the components may be made without departing from the spirit or scope of the claims as set forth herein. Additional components, different components, and/or fewer components may be provided.

In an embodiment, the imaging device 400 may be coupled to or incorporated into a system, such as a portable device (e.g., mobile phone), a vehicle (e.g., a terrestrial, naval, aerial, and/or space vehicle), or generally any electronic system that may utilize the imaging device 400 for imaging applications. The imaging device 400 may capture image data and provide the captured image data (e.g., with or without processing) to the system.

The imaging device 400 includes the lens assembly 405, a lens holder 410, an imager assembly 415, and an electronics assembly 420. The lens assembly 405 includes a lens barrel 422 and a lens 485 at least partially within the lens barrel 422. The lens assembly 405, the lens holder 410, the imager assembly 415, and the electronics assembly 420 are coupled together to facilitate imaging applications. The lens holder 410 includes a receiving interface 430 to receive the lens assembly 405 and secure the lens assembly 405 to the lens holder 410. As shown in FIG. 4A, at least a portion of the lens assembly 405 is received within the receiving interface 430 of the lens holder 410. In this regard, the lens holder 410 may include an inner surface that defines an aperture to receive the lens assembly 405. In some cases, the receiving interface 430 and/or the lens barrel 422 may include threads and/or other engagement features to facilitate securing of the lens barrel 422 to the lens holder 410.

The lens holder 410 couples to the electronics assembly 420. The lens holder 410 may be securely coupled (e.g., sealed together, held together, attached, and/or other coupling mechanism) to the electronics assembly 420 using engagement elements 455A-D. The imager assembly 415 is enclosed between the lens holder 410 and the electronics assembly 420. The imager assembly 415 may be coupled to the lens holder 410 and/or the electronics assembly 420. As one example, the electronics assembly 420 may include one or more interfaces that can receive the imager assembly 415 and/or may otherwise provide one or more surfaces onto which the imager assembly 415 may be mounted. As another example, alternatively or in addition, connecting pins, such as a connecting pin 472, may be utilized to secure the imager assembly 415 to the electronics assembly 420. In some aspects, securing of these various components, such as securing of the lens holder 410 (and the lens assembly 405 at least partially therein) to the electronics assembly 420 and securing of the imager assembly 415 to the electronics assembly 420, may allow proper optical alignment of the lens assembly 405, the lens holder 410, and the imager assembly 415. For example, when aligned, the lens assembly 405, the lens holder 410, and the imager assembly 415 may share a common optical axis.

To allow the coupling, the engagement elements 455A-D may be provided through corresponding receiving structures 460A-D (e.g., receiving apertures) of the lens holder 410 and corresponding receiving structures 465A-D of the electronics assembly 420. In an aspect, as shown in FIGS. 4C and 4D, the engagement elements 455A-D are screws that can be inserted through the receiving structures 460A-D and 465A-D and tightened to securely couple the lens holder 410 to the electronics assembly 420. In another aspect, the engagement elements 455A-D may generally be any other mechanical/physical fasteners, glue, epoxy, sealers and/or sealants, other chemical bonding mechanism, and/or generally any mechanism to securely couple the lens holder 410 to the electronics assembly 420. In one non-limiting case, the lens holder 410 may be secured to the electronics assembly 420 after the imager assembly 415 has been appropriately coupled (e.g., mounted, attached) to the lens holder 410 and/or the electronics assembly 420. In one non-limiting case, the lens holder 410 may be secured to the electronics assembly 420 before the lens holder 410 receives therein the lens assembly 405, after the lens holder 410 has received therein the lens assembly 405, or while the lens holder 410 is receiving therein the lens assembly 405.

The imager assembly 415 includes a housing 470 (e.g., also referred to as a package, a casing, a package housing, or an enclosure), a detector circuit 435, a readout circuit 440 (e.g., ROIC), a light shield 425, and a transmissive window 475. In some embodiments, the imager assembly 415 may be implemented as a vacuum package assembly. In these embodiments, the housing 470 may be referred to as a vacuum package, a vacuum package housing, and other variants. The housing 470 encloses the detector circuit 435, the readout circuit 440, and the light shield 425. The housing 470 may have an interface for receiving the transmissive window 475, such that the transmissive window 475 is at least partially within the housing 470. For example, in FIGS. 4A-4D, the housing 470 may have a square-shaped aperture for receiving the transmissive window 475.

The detector circuit 435 may be utilized to capture image data (e.g., still image data and/or video data). For example, the detector circuit 435 may be a multi-pixel detector, where each pixel (e.g., each image sensor) of the multi-pixel detector captures image data representative of a respective portion of the scene. EM radiation of the image scene may pass through the transmissive window 475 and be detected by the detector circuit 435. Physical properties (e.g., material composition, thickness and/or other dimensions, etc.) of the transmissive window 475 may be determined based on a waveband(s) desired to be transmitted through the transmissive window 475 to reach the detector circuit 435. The readout circuit 440 may obtain and/or generate signals indicative of the image data captured by the detector circuit 435. In an embodiment, the detector circuit 435 may be, may include, or may be a part of the image detector circuit 165 of FIG. 1, and/or the readout circuit 440 may be, may include, or may be a part of, the readout circuit 170 of FIG. 1.

The light shield 425 couples to the readout circuit 440 and/or the detector circuit 435. The light shield 425 is utilized to block stray light from reaching the detector circuit 435, such as blocking the stray light from an active area of the detector circuit 435. For example, similar to a situation illustrated in FIG. 3B, the light shield 425 may block stray light by preventing the stray light from refracting at one or more edges of the detector circuit 435 and being captured by an active area of the detector circuit 435. In an embodiment, the light shield 425 is in contact with a surface of the readout circuit 440 and positioned in proximity to (e.g., directly adjacent to) the detector circuit 435. In this regard, the surface of the readout circuit 440 may be utilized to physically support the light shield 425 to allow the light shield 425 to block stray light from being captured by the detector circuit 435. In an embodiment, the detector circuit 435, the readout circuit 440, and the light shield 425 may be, may include, or may be a part of the detector array 300, the readout circuit 315, and the light shield 320, respectively, of FIG. 3B.

As shown in FIGS. 4A and 4D, the imager assembly 415 may also include other components at least partially within the housing 470. The imager assembly 415 includes a spacer 445 and a thermoelectric cooler 495. The spacer 445 is coupled to the readout circuit 440. The spacer 445 may be a copper spacer. The spacer 445 may be used to provide physical support, insulation, supporting electronics, and/or height adjusting, and/or facilitate electrical coupling to other circuitry. In this case, the spacer 445 is used to physically support, for example, the detector circuit 705, the readout circuit 440, and the light shield 425. The thermoelectric cooler 495 may be utilized to control temperature of the detector circuit 435, the readout circuit 440, the spacer 445, other components at least partially within the imager assembly 415, and/or components at least partially within the electronics assembly 420. The thermoelectric cooler 495 may be provided on a surface of (e.g., embedded in a base of) the housing 470 and coupled to the spacer 445. In some cases, such as explicitly shown in FIG. 4C, the imager assembly 415 includes a tip-off tube 478.

In some aspects, as shown in FIG. 4D, the electronics assembly 420 includes supporting electronics 480 to receive, process, transmit, and/or record the captured image data. For example, the supporting electronics 480 may be coupled to the readout circuit 440 via connecting pins (e.g., vias), such as the connecting pin 472. In this regard, the supporting electronics 480 may receive image data from the readout circuit 440 via the connecting pins. The connecting pins may extend through a surface of (e.g., the base of) the housing 470 so that the connecting pins may join the readout circuit 440 to the supporting electronics 480. In some cases, the supporting electronics 480 may be provided by a system coupled to the imaging device 400, such as a mobile device that serves as a host device for the imaging device 400. In an example, the supporting electronics 480 may include the processing component 105, control component 125, the sensing component 135, the display component 130, and/or the memory component 110 as illustrated in FIG. 1.

Although FIG. 4A shows a lens assembly with a single lens, the lens assembly may include one or more additional optical elements, such as one or more mirrors, beamsplitters, and/or lenses to facilitate directing of image data from a scene to the imaging assembly 415. In some cases, the optical elements may provide adjustable optical parameters to the imaging device 400, including adjustable zoom, resolution, focus, and/or other optical parameters. For example, the imager assembly 415 and the supporting electronics 480, may provide control signals to adjust the optical parameters of the optical elements.

In an embodiment, the imaging device 400 may be utilized for capturing infrared image data of a scene. In this regard, properties (e.g., material composition, dimensions, etc.) of various components, such as the lens 485, the transmissive window 475, and the detector circuit 435, may be selected to facilitate capture of infrared image data (e.g., image data within a desired waveband(s) of the infrared spectrum). In some cases, properties of other components, such as a material of the lens barrel 422, the housing 470, and so forth, may also affect capture of infrared image data and thus may be selected to facilitate such capture. For example, the lens assembly 405 may be configured to pass, and the imager assembly 415 may be configured to capture and process, infrared radiation such as SWIR radiation, MWIR radiation, LWIR radiation, and/or other portion of the IR spectrum. Alternatively and/or in addition, the imaging device 400 may be utilized for capturing visible-light image data, and/or image data associated with other parts of the EM spectrum. In an embodiment, the imaging device 400 may be provided as, or as part of, an infrared imaging system. An example of an infrared imaging system is provided in U.S. patent application Ser. No. 15/466,599 filed Mar. 22, 2017 and entitled "MODULAR SPLIT-PROCESSING INFRARED IMAGING SYSTEM", which is incorporated herein by reference in its entirety.

Figure 5A:
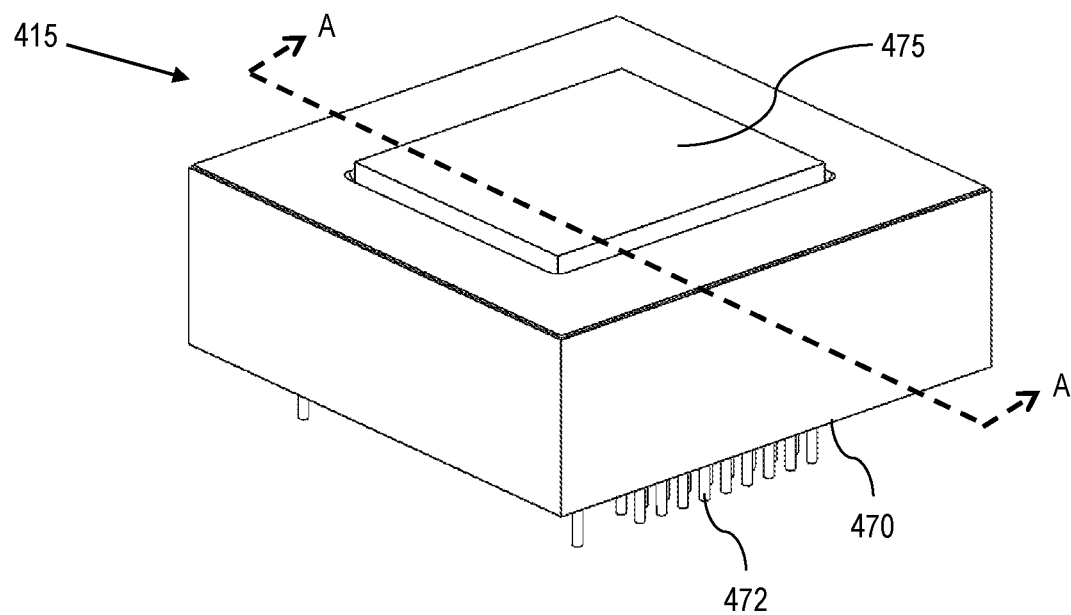
FIGS. 5A through 5C illustrate close up views of an imager assembly of the imaging device (or portion thereof) of FIG. 4A in accordance with one or more embodiments of the present disclosure.
Figure 5B:
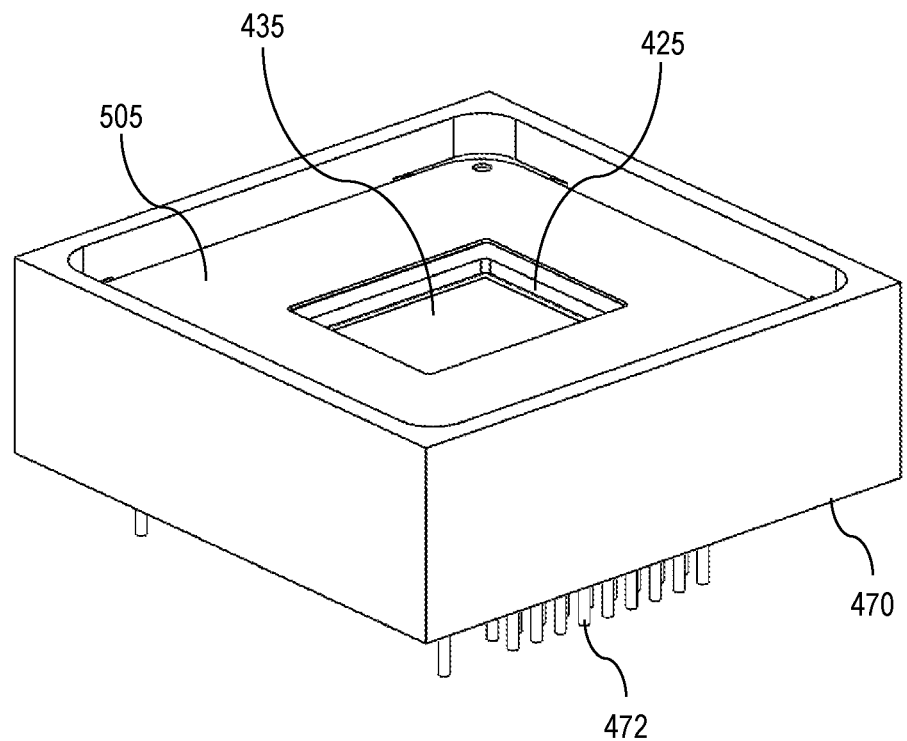

As shown in FIG. 5B, a top portion of the imager assembly 415 is obscured to expose an interior of the imager assembly 415. The imager assembly 415 includes a baffle 505 within the housing 470. The baffle 505 may be coupled to interior sidewalls of the housing 470. The baffle 505 is disposed over the detector circuit 435. The baffle 505 may be utilized to allow a desired light signal to reach the detector circuit 435 while blocking stray light. In some aspects, the baffle 505 may block stray light by scattering the stray light, and the light shield 425 may absorb residual stray light that passes the baffle 505 and/or other stray light. In some cases, the baffle 505 may be arranged to mitigate disturbance light (e.g., stray light, reflecting light). Reflecting light may refer to reflection of incoming EM radiation caused by the detector circuit 435 and one or more optical elements close to the detector circuit 435. Such reflection may be caused (e.g., primarily caused) by an optical element (e.g., a lens) closest to the detector circuit 435. In some cases, the baffle 505 may be considered as or referred to as a second light shield or second stray light shield, relative to a first light shield or first stray light shield provided by the light shield 425. In an aspect, the light shield 425 is temperature-stabilized (e.g., not temperature-cooled), whereas the baffle 505 may be temperature-cooled.

Figure 5C:
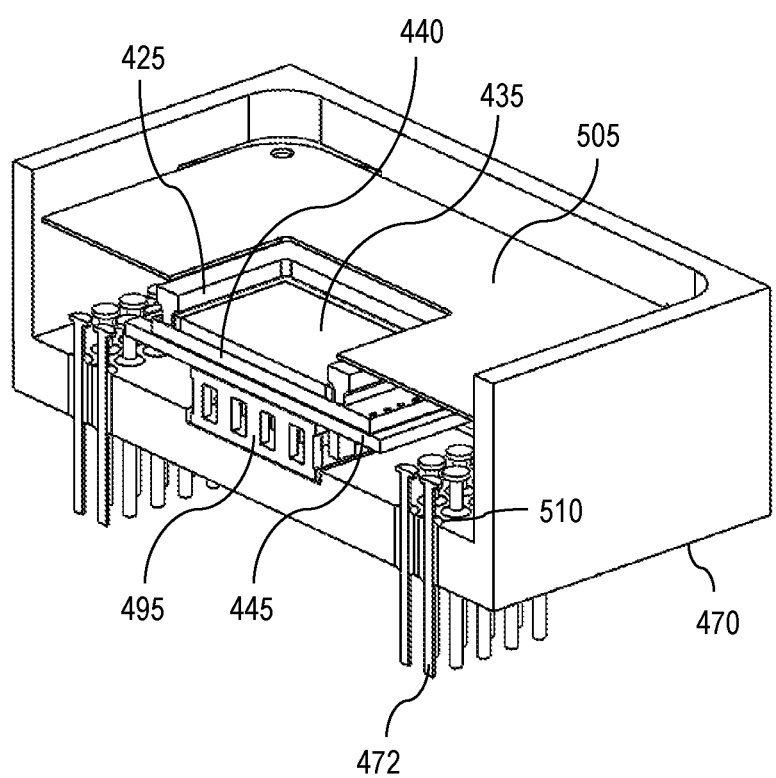

As shown in FIG. 5C, in an embodiment, the light shield 425 is coupled to (e.g., in contact with) the readout circuit 440. In other embodiments, alternatively or in addition, the light shield 425 may be coupled to (e.g., in contact with) the detector circuit 435. In other embodiments, the light shield 425 may be coupled to the detector circuit 435 and the readout circuit 440. The light shield 425 is in proximity to (e.g., directly adjacent to) the detector circuit 435. In an aspect, as illustrated in FIG. 5C, the readout circuit 440 has dimensions that extend beyond dimensions of the detector circuit 435 to provide a surface area of the readout circuit 440 that can physically support the light shield 425. In an embodiment, the detector circuit 435 may be hybridized to the readout circuit 440, for example, in or similar to the manner illustrated in FIG. 2B.

The connecting pins extend through the base of the housing 470. The connecting pins may connect the imager assembly 415 to components downstream of the imager assembly 415, such as the supporting electronics 480. In some cases, in order to insulate the connecting pins from the housing 470, an insulator may be provided around the connecting pins. For example, the insulator may include glass beads extended through the base and surrounding the connecting pins. In FIG. 5C, an insulator 510 surrounds the connecting pin 472. In some embodiments, one or more of the connecting pins may be grounded to the housing 470.

Figure 6A:
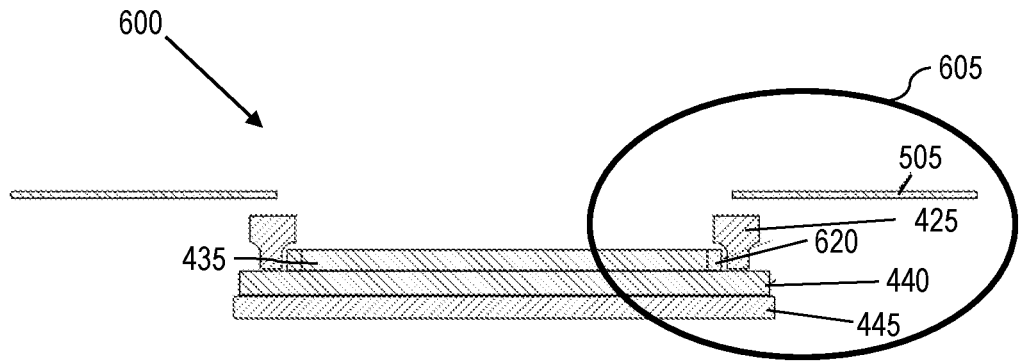
FIG. 6A illustrates a sectional view of an imaging device in accordance with one or more embodiments of the present disclosure.
Figure 6B:
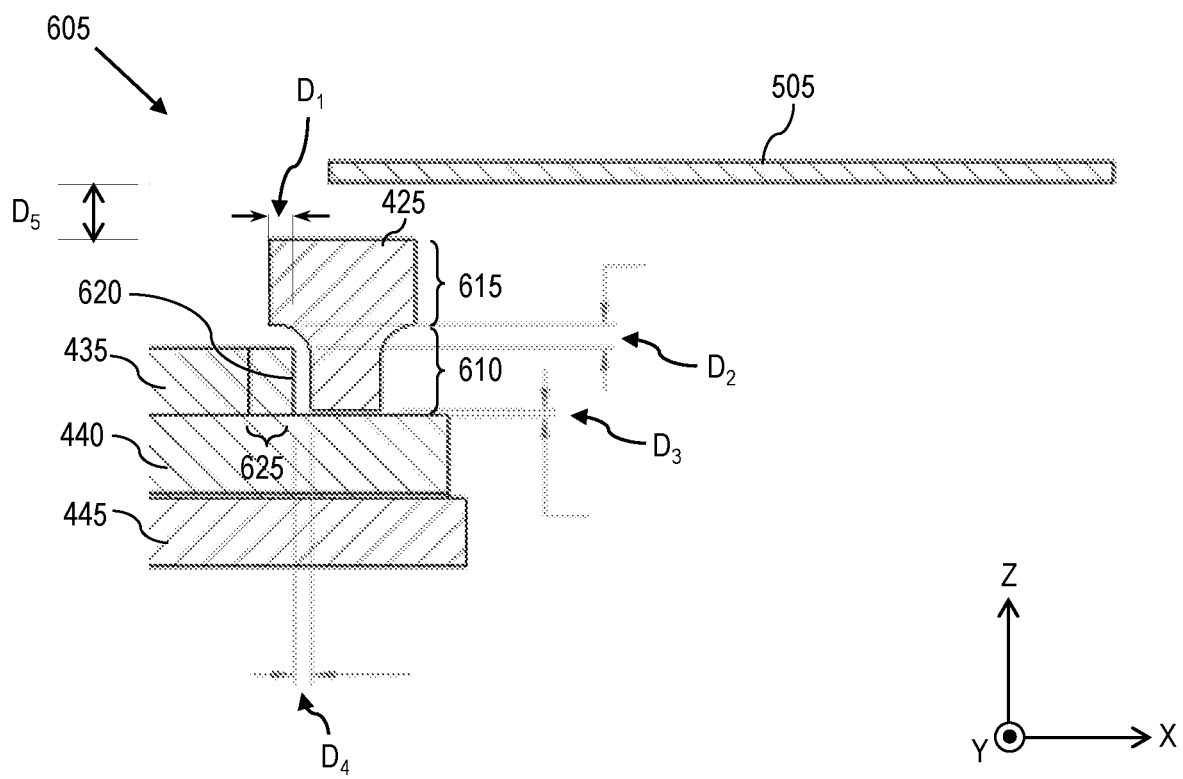
FIG. 6B illustrates a magnified view of a portion of the imaging device of FIG. 6A in accordance with one or more embodiments of the present disclosure.

FIG. 6A illustrates a sectional view of an imaging device 600 in accordance with one or more embodiments of the present disclosure. FIG. 6B illustrates a magnified view of a portion 605 of the imaging device 600 of FIG. 6A. Not all of the depicted components may be required, however, and one or more embodiments may include additional components shown in the figures. Variations in the arrangement and type of the components may be made without departing from the spirit or scope of the claims as set forth herein.

Additional components, different components, and/or fewer components may be provided.

The imaging device 600 includes the baffle 505, the light shield 425, the detector circuit 435, the readout circuit 440, and the spacer 445. A portion 625 of the detector circuit 435 may be a non-active area of the detector circuit 435. In FIGS. 6A and 6B, the light shield 425 has a T-shaped cross-section. It is noted that FIGS. 6A and 6B provide a sectional view of the light shield 425. As shown for example in FIG. 5C, the light shield 425 may surround and form a perimeter around the detector circuit 435. In this regard, the light shield 425 is formed along a periphery of the detector circuit 435. The light shield 425 includes a leg 610 (e.g., also referred to as a bottom portion or a base) and a wall 615 extending from the leg 610. The leg 610 and the wall 615 are each rectangular or substantially rectangular, with the wall 615 extending beyond the leg 610 in the X direction and the Y direction (e.g., Y direction is directed out of the page) to form the T-shape. It is noted that labeling of the leg 610 and the wall 615 may be arbitrary and utilized for convenience to identify different portions (e.g., differently sized and/or shaped portions) of the light shield 425. In some embodiments, the leg 610 and the wall 615 may be formed as part of the same process, such as a machining process or an additive manufacturing process. For example, the leg 610 and the wall 615 may be an integrated structure in which the leg 610 and the wall 615 are machined from a single block of material to form the light shield 425. As an example, to facilitate infrared imaging, the leg 610 and the wall 615 may be machined from a block of black aluminum oxide. In other embodiments, the leg 610 and the wall 615 may be separately formed and attached using engagement features such as, by way of non-limiting example, adhesive, screws, pins, and/or other features.

The leg 610 and the wall 615 extends past a vertical edge 620 of the detector circuit 435. The leg 610 couples to the readout circuit 440. The leg 610 may have rounded (e.g., curved, beveled) edges or corners that extends outward toward the wall 615. In another case (not shown in FIGS. 6A and 6B), the leg 610 may extend outward toward the wall 615 via a non-rounded edges or corners. A distance $D_1$ is a distance between an inside edge of the wall 615 and the vertical edge 620 and represents a distance that the wall 615 extends over the vertical edge 620. In one example, the distance $D_1$ may be approximately between 0.000 inches (e.g., in contact, touching) and 0.010 inches. The leg 610 is coupled to the readout circuit 440. A distance $D_2$ is a distance (e.g., space) between a top surface of the detector circuit 435 and a bottom surface of the wall 615 that extends over the vertical edge 620. In one example, the distance D2 may be approximately between 0.000 inches (e.g., in contact, touching) and 0.010 inches. A distance $D_3$ is a distance between a top surface of the readout circuit 440 and a bottom surface of the leg 610. The distance $D_3$ may be based on dimensions associated with an engagement feature (e.g., adhesive, screw, pin, and/or others) utilized to couple the readout circuit 440 to the leg 610. In one example, the distance $D_3$ may be approximately between 0.000 inches (e.g., in contact, touching) and 0.002 inches. A distance $D_4$ is a distance between the vertical edge 620 and an edge of the leg 610 that faces the vertical edge 620. In one example, the distance $D_4$ may be approximately between 0.000 inches (e.g., in contact, touching) and 0.005 inches.

A distance $D_5$ is a distance between a top surface of the wall 615 of the light shield 425 and a bottom surface of the baffle 505. In an embodiment, utilizing the baffle 505 and the light shield 425 in tandem facilitates blocking of stray light. Positioning of the baffle 505 is generally associated with tradeoffs. The baffle 505 generally blocks more stray light as the distance $D_5$ is made smaller. As the distance $D_5$ is made smaller, a shadow over the detector circuit 435 (e.g., over the active area of the detector circuit 435) formed by the baffle 505 may increase in size, which generally adversely affects capturing of image data by the detector circuit 435. With the light shield 425 present to absorb residual stray light that passes the baffle 505 and/or other stray light, the baffle 505 may be positioned at an appropriate distance over the detector circuit 435 to block (e.g., scatter) stray light while avoiding formation of a shadow over the detector circuit 435 (e.g., the active area of the detector circuit 435). In one example, the distance $D_5$ may be approximately between 0.000 inches (e.g., in contact, touching) and 0.030 inches.

Figure 7A:
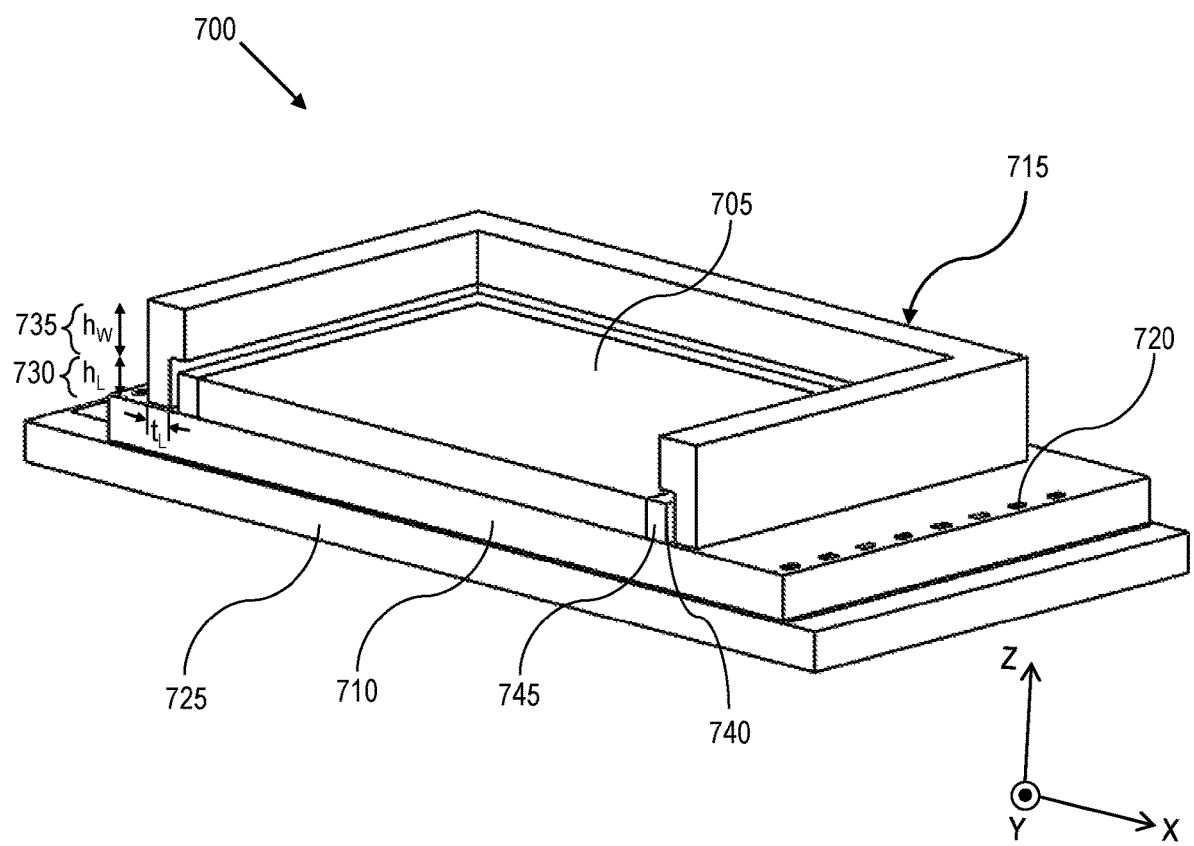
FIG. 7A illustrates a cross-section of an example imaging device in accordance with one or more embodiments of the present disclosure.
Figure 7B:
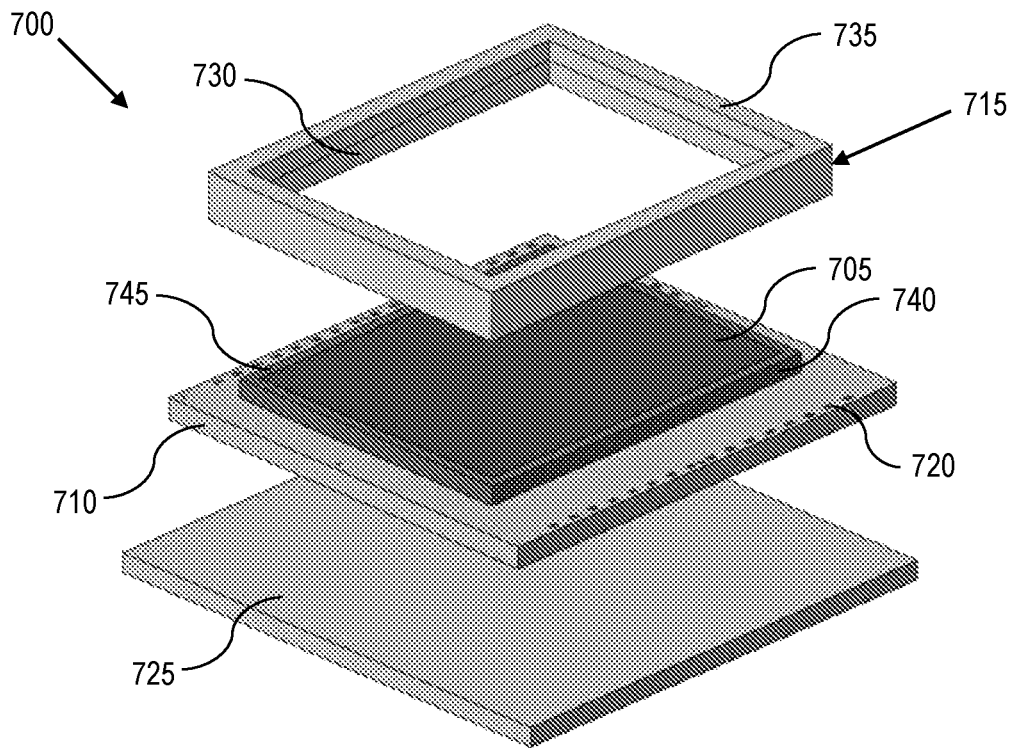
FIG. 7B illustrates an exploded view of the imaging device of FIG. 7A in accordance with one or more embodiments of the present disclosure.

FIG. 7A illustrates a cross-section of an example imaging device 700 in accordance with one or more embodiments of the present disclosure. FIG. 7B illustrates an exploded view of the imaging device 700 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the imaging device 700 may be provided within a housing, such as the housing 470 of FIG. 4C.

Referring to FIGS. 7A and 7B, the imaging device 700 includes a detector circuit 705, a readout circuit 710, a light shield 715, a spacer 725, and contacts (e.g., including a contact 720). In an embodiment, the detector circuit 705, the readout circuit 710, and the light shield 715 may be, may include, or may be a part of the detector array 300, the readout circuit 315, and the light shield 320, respectively, of FIG. 3B.

The detector circuit 705 may be a detector array that includes an array of detectors (e.g., photodetectors, microbolometers), with each detector detecting EM radiation and generating a pixel value based on the detected EM radiation. The pixel value of a detector circuit 705 may be, or may be indicative of, a detector signal (e.g., detector voltage, detector current) generated by the detector in response to the EM radiation. The readout circuit 710 provides a readout of image data captured by the detector circuit 705. In an example, the image data that is read out may be communicated to other circuitry (e.g., the supporting electronics 480 of FIG. 4D) for processing, storage, and/or display. In an embodiment, the detector circuit 705 may be hybridized to the readout circuit 710, for example, in the manner illustrated in FIG. 2B. The contacts may be bond pads to facilitate communication of data to and from the readout circuit 710.

The light shield 715 includes a leg 730 that is coupled to a surface of the readout circuit 710 and in proximity to (e.g., directly adjacent to) the detector circuit 705. The light shield 715 may be coupled (e.g., affixed, attached, fastened, mounted, connected) to the detector circuit 705. In an aspect, tolerance associated with manufacturing of various components, such as the detector circuit 705, the readout circuit 710, and/or the light shield 715, may be taken into consideration to allow the leg 730 to proximately align the light shield 715 with the detector circuit 705. For example, the leg 730 may be used to proximately align the light shield 715 about the detector circuit 705 by determining appropriate tolerances based on a size of the detector circuit 705 in the X, Y, and/or Z directions. In some cases, the light shield 715 is appropriately positioned (e.g., with consideration to tolerances) to prevent stray light from impinging on vertical edges, such as a vertical edge 740, of the detector circuit 705.

A height $h_L$ of the leg 730 may be determined based on a height of the detector circuit 705 and a clearance (e.g., vertical gap) between the detector circuit 705 and a wall 735 extending from the leg 730. In one case, the height $h_L$ may be determined based on a tolerance analysis considering a maximum Z-direction height of the detector circuit 705 with respect to the readout circuit 710 and a predefined clearance between the detector circuit 705 and the wall 735. A thickness $t_L$ of the leg 730 may be determined at least in part based on a position of the contacts (e.g., including the contact 720) relative to the vertical edges (e.g., including the vertical edge 740) of the detector circuit 705.

The wall 735 (e.g., also referred to as a top portion) of the light shield 715 extends from the leg 730. As illustrated in FIG. 7A, the light shield 715 has an L-shaped cross section. The wall 735 is formed such that a portion of the wall 735 extends over the vertical edges of the detector circuit 705 in the X and Y directions (e.g., toward the center of the detector circuit 705) to block stray light from striking the vertical edges 540. In this regard, the light shield 715 defines an aperture (e.g., an opening) that is in-board of the vertical edges of the detector circuit 705. In an aspect, the light shield 715 generally does not overlap an active area of the detector circuit 705 to mitigate blocking, by the light shield 715, of a desired light signal from reaching the detector circuit 705. Dimensions of the aperture may be determined (e.g., by a tolerance analysis) with consideration to a number of pixels (e.g., associated with a physical distance) from the vertical edges (e.g., outmost surfaces of the detector circuit 705) to the active area of the detector circuit 705. In an aspect, as illustrated in FIG. 7A, the wall 735 of the light shield 715 extends over the vertical edges and a non-active area 745 (e.g., area outside the active area) of the detector circuit 705 by a clearance amount (e.g., predefined clearance amount) and not be in contact with the vertical edges and the non-active area of the detector circuit 705. In another aspect, a wall of a light shield may be in contact with vertical edges and/or a non-active area of a detector circuit.

In some embodiments, the leg 730 and the wall 735 may be an integrated structure where the leg 730 and the wall 735 are machined from a block of material to form the light shield 715. In other embodiments, the light shield 715 may be formed by attaching two or more separate structures as the leg 730 and the wall 735 using appropriate materials to attach the separate structures, including adhesive, screws, pins, and/or other materials.

In some embodiments, such as shown in FIGS. 7A and 7B, a leg and a wall of a light shield may be a substantially rectangular or square structure; however, other shapes for a leg and a wall may also be contemplated to block stray light from entering an active area of a detector circuit. In this regard, a shape and a size of the light shield 715 (e.g., the leg 730 and/or the wall 735) may be determined based on a shape and a size of the detector circuit 705. Although the leg 730 and the wall 735 are shown as forming an L-shaped cross section with a 90° angle, in one example variant, a portion of the wall 735 that extends over the vertical edges of the detector circuit 705 may include a sloped portion (e.g., triangular portion) and/or a rounded portion.

Figure 8:
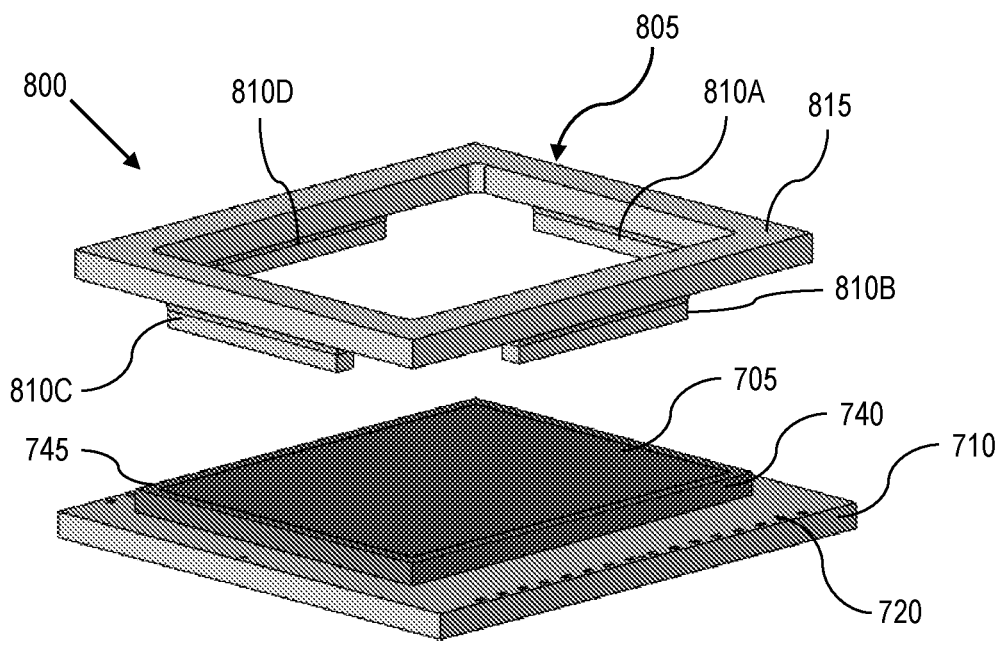
FIG. 8 illustrates an exploded view of an example imaging device in accordance with one or more embodiments of the present disclosure.

Furthermore, although the leg 730 is formed as a continuous structure around the detector circuit 705, a light shield may include multiple discrete leg structures (e.g., discrete posts) around the detector circuit 705. For example, FIG. 8 illustrates an exploded view of an example imaging device 800 in accordance with one or more embodiments of the present disclosure. The imaging device 800 includes a light shield 805, the detector circuit 705, the readout circuit 710, and contacts (e.g., including the contact 720). The imaging device 800 may include a spacer (e.g., the spacer 725). The light shield 805 includes legs 810A-D and a wall 815. The legs 810A-D may couple to a surface of the readout circuit 710. The legs 810A-D may include a rounded (e.g., curved, beveled) portion that extends to the wall 815 (e.g., a bottom surface of the wall 815).

Figure 9:
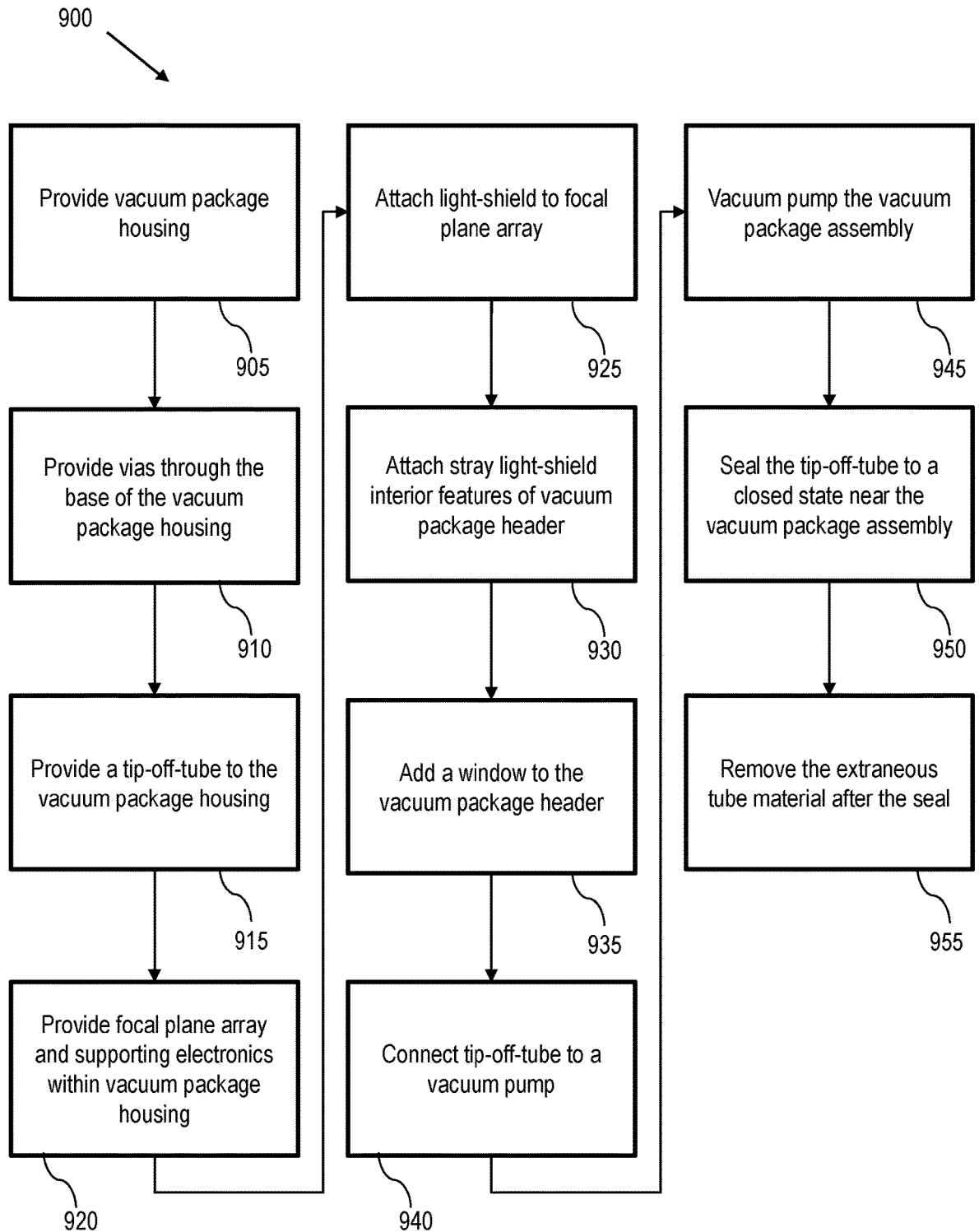
FIG. 9 illustrates a flow diagram of an example process for manufacturing an imaging device in accordance with one or more embodiments of the present disclosure.

FIG. 9 illustrates a flow diagram of an example of a process 900 for manufacturing an imaging device in accordance with one or more embodiments of the present disclosure. For explanatory purposes, the process 900 is described herein with reference to various components of one or more of FIGS. 1-8; however, the process 900 is not limited to various components of FIGS. 1-8. Note that one or more operations may be combined, omitted, and/or performed in a different order as desired.

At block 905, a vacuum package housing is provided. In some cases, the vacuum package housing may be the housing 470 of FIG. 4A. The vacuum package housing may be formed of a single integrated structure or of discrete structures (e.g., separately formed walls of the housing) coupled to each other. The vacuum package housing may be substantially rectangular, although other shapes may be utilized. The vacuum package housing may be formed from Kovar, an iron-nickel-cobalt alloy, or 304L stainless steel.

At block 910, vias are provided through a base of the vacuum package housing. The vias may correspond to the connecting pins (e.g., including the connecting pin 472 of FIG. 4A). The vias may be insulated from the base of the vacuum package housing using insulators (e.g., the insulator 510 of FIG. 5C). Such insulators may also be provided at block 910. The vias may allow connection of a focal plane array (e.g., formed of at least the detector circuit 435 and the readout circuit 440) and/or supporting electronics (e.g., the supporting electronics 480) disposed within an interior cavity of the vacuum package housing with external electronics.

At block 915, a tip-off tube (e.g., the tip-off tube 478) in an open state is provided to an aperture in order to provide a vacuum within a completed vacuum package assembly formed from the vacuum package housing. The tip-off tube may be constructed of a metal or other pliable material, such as copper.

In order to attach a window (e.g., the transmissive window 475 of FIG. 4A) so that the tip-off tube forms the only channel between the interior cavity and an external environment, the focal plane array and supporting electronics are added to the vacuum package housing to form the vacuum package assembly. Thus, at block 920, a focal plane array and supporting electronics are provided within the vacuum package housing. For example, the focal plane array and the supporting electronics may be disposed in the interior cavity of the vacuum package housing. The supporting electronics may be connected to the connecting pins (e.g., the vias) in order to allow for later mounting of the vacuum package assembly and communication of image data.

At block 925, a light shield is attached to the focal plane array. The light shield may be coupled to a readout circuit. For example, the light shield may be attached to the focal plane array via adhesive, screws, pins, or other materials. In one case, the light shield may be attached to the readout circuit by hand with a Z-scope and an adhesive. In one embodiment, the light shield may be one of the light shields 425, 715, 805, or 1005.

At block 930, stray light shield features (e.g., one or more baffles) are attached to the interior of a vacuum package header. At block 935, a window (e.g., the transmissive window 475) is added to the vacuum package header. For example, in FIG. 5A, the housing 470 is shown with the transmissive window 475.

Once the window is attached, a vacuum package assembly may be formed that includes the tip-off tube in an open state. In some cases, it may be desirable to maintain a vacuum around the focal plane array and the supporting electronics in the interior cavity. In order to provide a vacuum within the interior cavity, the tip-off tube may be connected to a vacuum pump to substantially evacuate the interior cavity and form the vacuum. At block 940, the tip-off tube is connected to a vacuum pump. At block 945, the vacuum package assembly is vacuum pumped. By vacuum pumping the vacuum package assembly, matter is removed from the internal cavity to form a vacuum around the focal plane array and the supporting electronics in the internal cavity.

Once the vacuum is formed, in order to maintain the vacuum, the tip-off tube is changed to a closed state. In this regard, at block 950, the tip-off tube is sealed to the closed state near the vacuum package assembly. For example, a pinch or crimp seal may be applied to the tip-off tube to close the tip-off tube. The pinch seal may be formed by utilizing a machine roller or other mechanism to pinch seal the tip-off tube by applying pressure to the pinch-off tube on the external surface, such as through a cold weld (e.g., using the heat of the pressure process). The pinch seal may also be formed through another process that seals the tip-off tube while maintaining the vacuum in the interior cavity. At block 955, after the tip-off-tube is sealed, extraneous tube material is removed from the seal.

Figure 10:
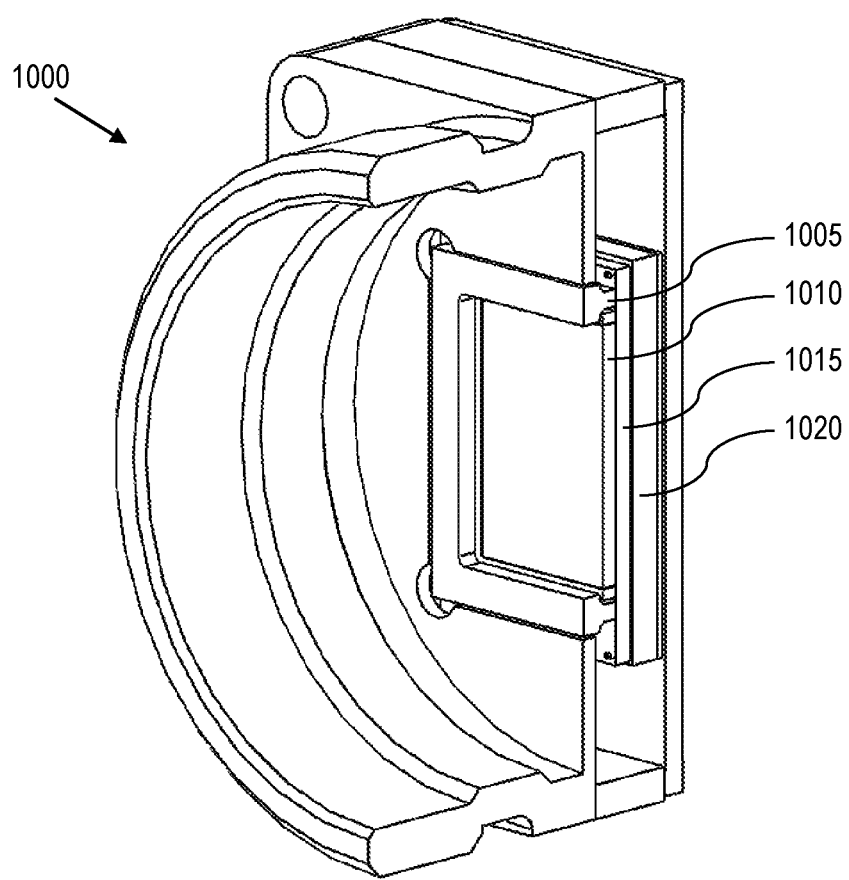
FIG. 10 illustrates an example imaging device in an open-frame device in accordance with one or more embodiments of the present disclosure.

Although the foregoing describes various embodiments in which an imager assembly (e.g., the imager assembly 415 of FIG. 4A) may be implemented as a vacuum package assembly, in other embodiments, the imager assembly is not implemented as a vacuum package housing. For example, FIG. 10 illustrates an imaging device 1000 in an open-frame device (e.g., open-frame camera) in accordance with one or more embodiments of the present disclosure. The imaging device 1000 includes a light shield 1005, a detector circuit 1010, a readout circuit 1015, and a spacer 1025. The foregoing description for FIGS. 1 through 9 generally apply to FIG. 10. Variations of the light shield 1005 and/or other components may be implemented as appropriate to accommodate an environment (e.g., open-frame camera, vacuum package assembly) within which the light shield 1005 and these other components are provided.

Figure 11:
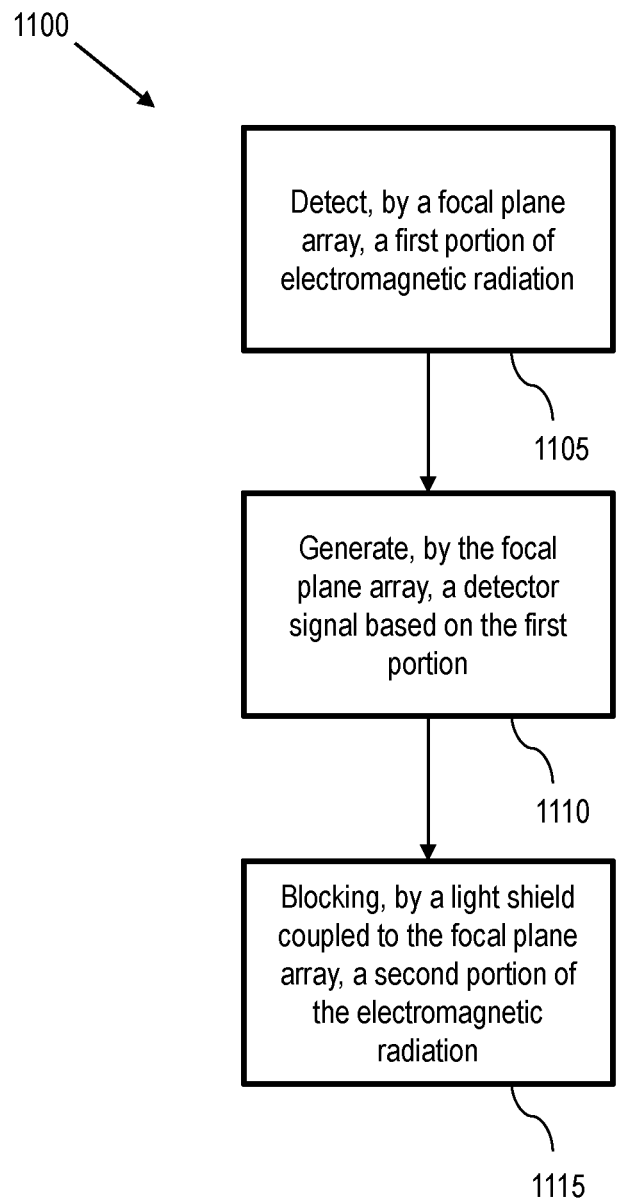
FIG. 11 illustrates a flow diagram of an example process for facilitating imaging in accordance with one or more embodiments of the present disclosure.

FIG. 11 illustrates a flow diagram of an example process 1100 for facilitating imaging in accordance with one or more embodiments of the present disclosure. For explanatory purposes, the process 1100 is described herein with reference to the imaging device 400 and components thereof shown in FIGS. 4A through 6B; however, the process 1100 is not limited to the imaging device 400 and components thereof shown in FIGS. 4A through 6B. Note that one or more operations may be combined, omitted, and/or performed in a different order as desired.

At block 1105, an FPA (e.g., the detector circuit 435 of an FPA) detects a first portion of EM radiation. At block 1110, the FPA generates a detector signal based on the first portion. At block 1115, a light shield (e.g., the light shield 425) formed around the FPA blocks a second portion of the EM radiation. For example, the second portion may include stray light that is directed to one or more edges of the detector circuit 435. In some cases, a waveband(s) associated with the first portion of the EM radiation may overlap at least a portion of a waveband(s) associated with the second portion of the EM radiation. In some aspects, a second light shield (e.g., the baffle 505) disposed over a portion of the detector circuit 435 and a portion of the light shield 425 blocks a third portion of the EM radiation. In some cases, the second portion may include residual EM radiation from the third portion that passes the second light shield and/or other stray EM radiation. In an embodiment, the light shield 425 may block stray EM radiation by absorbing the stray EM radiation whereas the baffle 505 may block stray EM radiation by scattering the stray EM radiation.

It is noted that dimensional aspects provided above, such as the distances $D_1$ through $D_5$ provided with respect to FIG. 6B, are by way of non-limiting example and are generally application dependent. Furthermore, as would be appreciated, such dimensional aspects are associated with dimensional tolerances.

Figure 12:
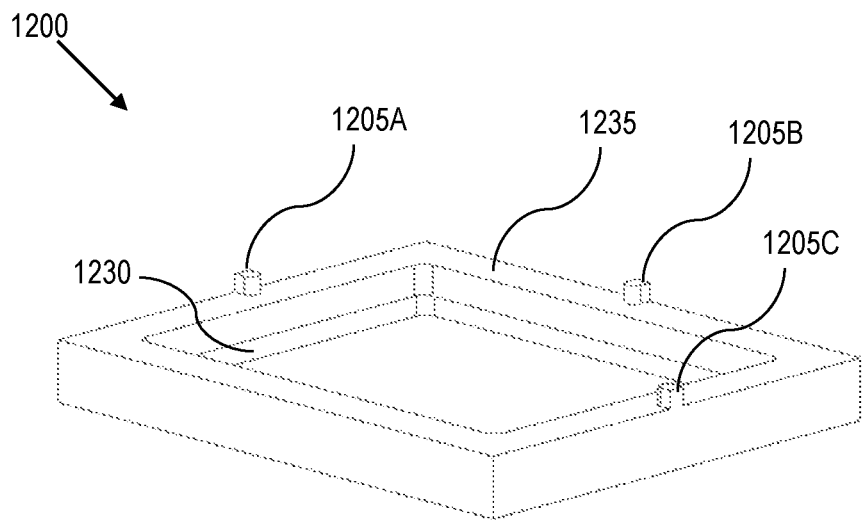
FIG. 12 illustrates a perspective view of an example alignment frame in accordance with one or more embodiments of the present disclosure.

FIG. 12 illustrates a perspective view of an alignment frame 1200 in accordance with one or more embodiments of the present disclosure. The alignment frame 1200 includes a leg 1230, a wall 1235, and alignment elements 1205A-C (e.g., also referred to as alignment features, aligning elements, and aligning features). The foregoing description of the leg 730 and the wall 735 of FIGS. 7A and 7B may generally be applied to the leg 1230 and the wall 1235 of FIG. 12. In an aspect, the alignment frame 1200 may be formed of a material appropriate to block stray light and thus may be utilized as a light shield to block stray light.

In an embodiment, the alignment elements 1205A-C extend from the wall 1235 of the alignment frame 1200 and are configured to facilitate aligning an optical element as the optical element couples to (e.g., is positioned in contact with) one or more surfaces of the wall 1235. As shown in FIG. 12, each of the alignment elements 1205A-C extends from a top surface of the wall 1235 and is at around a center of one of the four edges of the wall 1235. In this regard, the optical element may be aligned precisely with, and positioned in close proximity to, an active area of a focal plane array (e.g., a detector array). The leg 1230 may further facilitate aligning the optical element with the active area of the focal plane array. In an aspect, the optical element may be used to filter an electromagnetic wave band of interest as electromagnetic radiation approaches the active area of the focal plane array. As an example, the optical element may be a polarizer, Bayer pattern, or other type of filter or lens suitable for a given application. The size and position (e.g., arrangement, configuration) of the alignment elements 1205A-C may be determined by tolerance analysis of the optical element and the relationship (e.g., positional relationship) of the optical element to the active area of the focal plane array for a desired application. The alignment frame 1200 may have an aperture that is sized based on a size of the active region of the focal plane array. Dimensions of the aperture may be determined (e.g., by a tolerance analysis) with consideration to a number of pixels (e.g., associated with a physical distance) from the vertical edges to the active area of the focal plane array.

In some embodiments, the leg 1230, the wall 1235, and the alignment elements 1205A-C may be formed as part of the same process, such as a machining process or an additive manufacturing process. For example, the leg 1230, the wall 1235, and the alignment elements 1205A-C may be an integrated structure in which the leg 1230, the wall 1235, and the alignment elements 1205A-C are machined from a single block of material to form the alignment frame 1200. In an embodiment, to facilitate infrared imaging, the leg 1230, the wall 1235, and the alignment elements 1205A-C may be machined from a block of black aluminum oxide. In other embodiments, the leg 1230, the wall 1235, and the alignment elements 1205A-C may be separately formed and attached using engagement features such as, by way of non-limiting example, adhesive, screws, pins, and/or other features.

Figure 13:
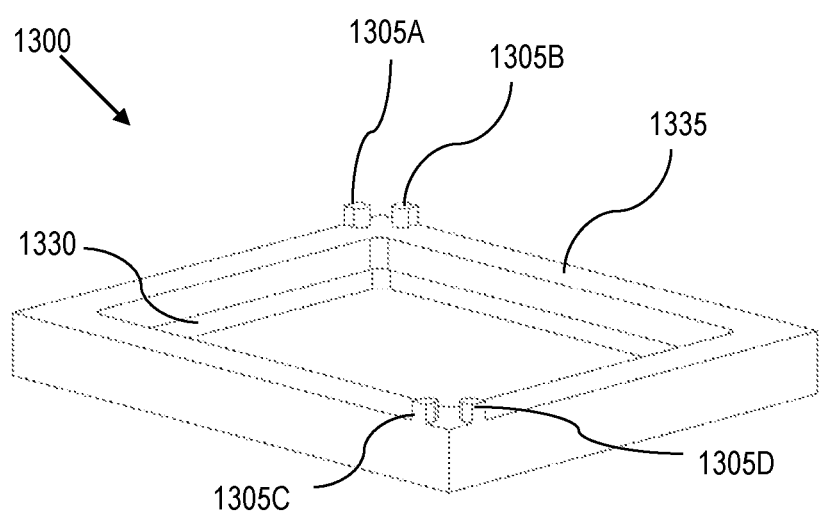
FIG. 13 illustrates a perspective view of an example alignment frame in accordance with one or more embodiments of the present disclosure.

FIG. 13 illustrates a perspective view of an alignment frame 1300 in accordance with one or more embodiments of the present disclosure. In an aspect, the alignment frame 1300 may be formed of a material appropriate to block stray light and thus may be utilized as a light shield to block stray light. The light shield includes a leg 1330, a wall 1335, and alignment elements 1305A-D. In FIG. 13, the alignment elements 1305A and 1305B are at around one vertex of the wall 1335, and the alignment elements 1305C and 1305D are at around another vertex of the wall 1335. Aside from the positions of the alignment elements 1305A-D, the foregoing description of the alignment frame 1200 of FIG. 12 may generally by applied to the description of the alignment frame 1300 of FIG. 13. While FIGS. 12 and 13 show various numbers and arrangements of alignment elements, an alignment frame may include any number of alignment elements and various arrangements of alignment elements suitable (e.g., to align and structurally support an optical element as appropriate) for a desired application. In one aspect, to provide support for an optical element, an alignment frame may include at least three alignment elements.

Figure 14:
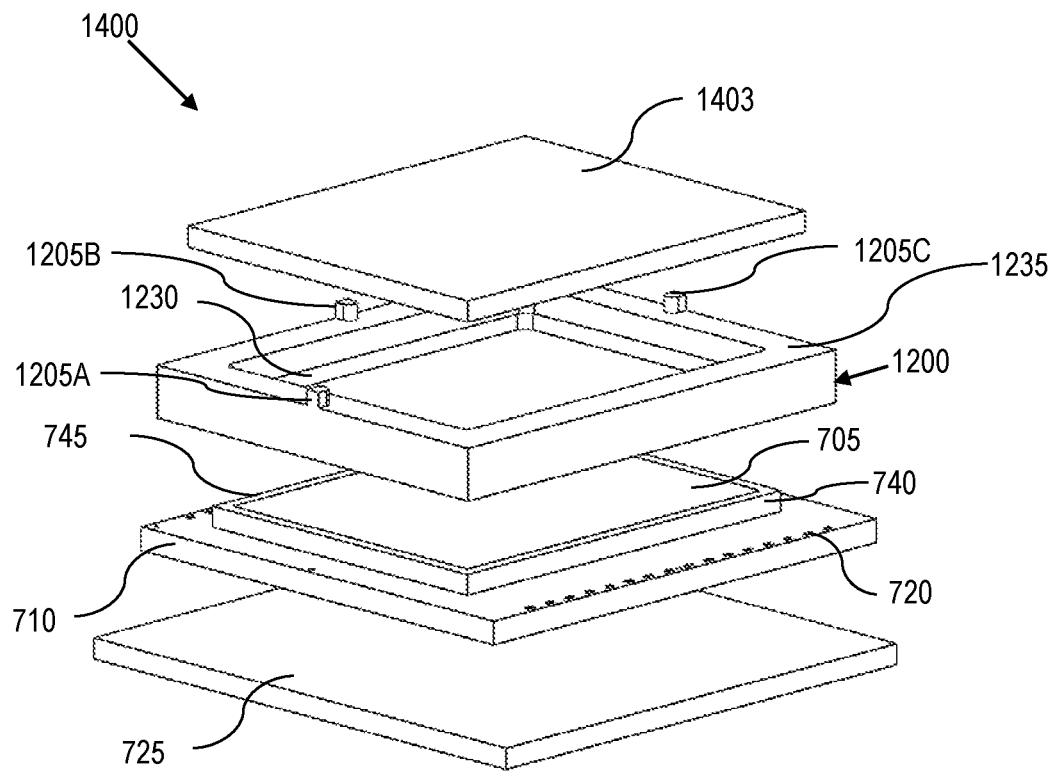
FIG. 14 illustrates an exploded view of an example imaging device in accordance with one or more embodiments of the present disclosure.
Figure 15:
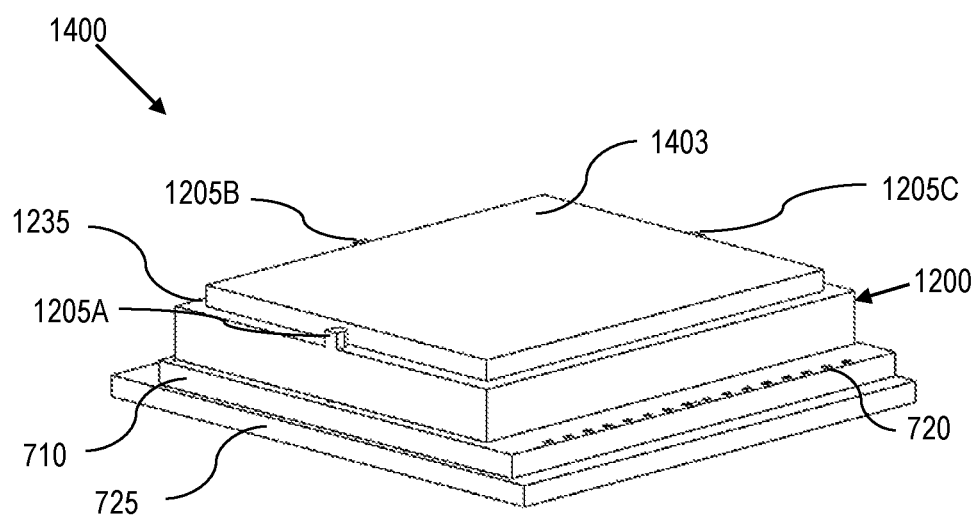
FIG. 15 illustrates a perspective view of the imaging device of FIG. 14 in accordance with one or more embodiments of the present disclosure.

FIG. 14 illustrates an exploded view of an imaging device 1400 in accordance with one or more embodiments of the present disclosure. FIG. 15 illustrates a perspective view of the imaging device 1400 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the imaging device 1400 may be provided within a housing, such as the housing 470 of FIGS. 4A-D.

Referring to FIGS. 14 and 15, the imaging device 1400 includes the detector circuit 705, the readout circuit 710, the spacer 725, and the contacts (e.g., including the contact 720) of FIGS. 7A and 7B, the alignment frame 1200 of FIG. 12, and an optical element 1403. The optical element 1403 is coupled to the alignment frame 1200 and aligned, as facilitated by the alignment elements 1205A-C, with the detector circuit 705 to allow for pixel-level alignment of patterns on optical/filter elements. The optical element 1403 may be placed in contact with the alignment elements 1205A-C and a top surface of the wall 1235. In this regard, the alignment frame 1200 physically supports the optical element 1403. In an aspect, the optical element 1403 may be used to filter a wave band of the electromagnetic spectrum. The optical element 1403 may be a polarizer, Bayer pattern, or other type of lens or filter suitable for a given application. For example, the optical element 1403 may be a frequency-selective lens used to filter incident radiation by allowing signal components within a wave band(s) of interest to reach the detector circuit 705 while blocking (e.g., attenuating) signal components outside the wave band(s) of interest.

Figure 16:
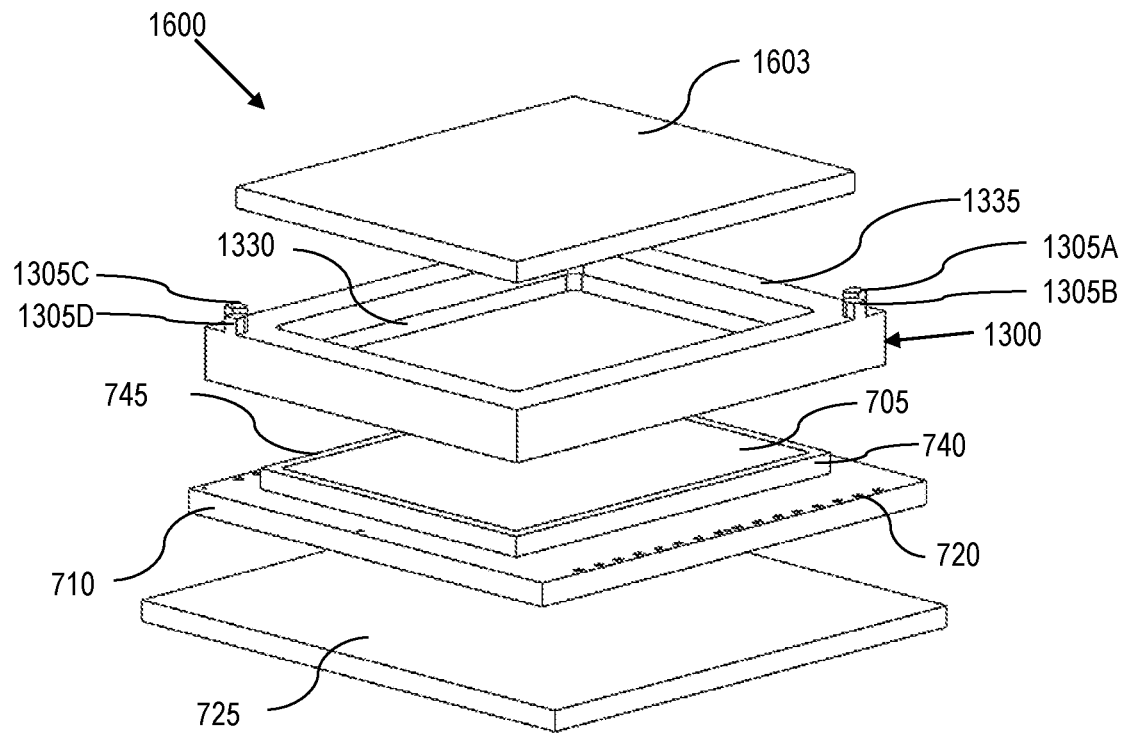
FIG. 16 illustrates an exploded view of an example imaging device in accordance with one or more embodiments of the present disclosure.
Figure 17:
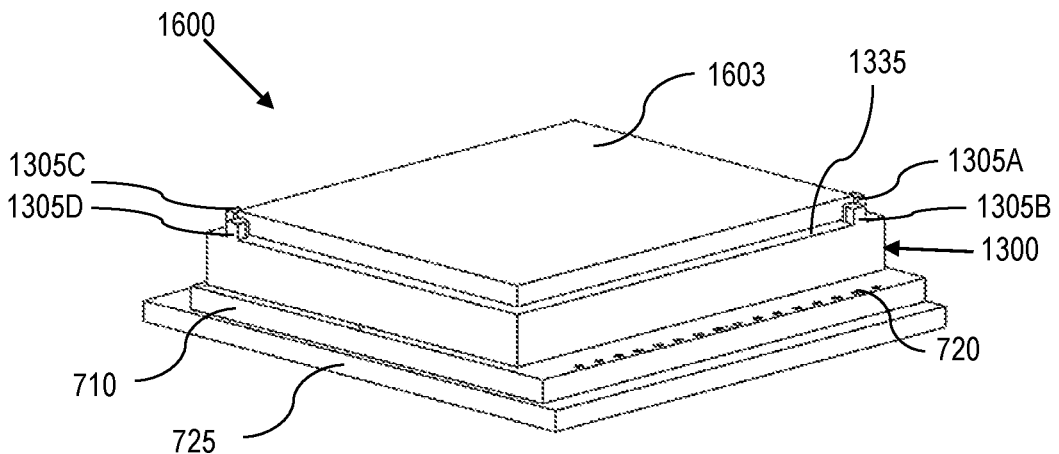
FIG. 17 illustrates a perspective view of the imaging device of FIG. 16 in accordance with one or more embodiments of the present disclosure.

FIG. 16 illustrates an exploded view of an imaging device 1600 in accordance with one or more embodiments of the present disclosure. FIG. 17 illustrates a perspective view of the imaging device 1600 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the imaging device 1600 may be provided within a housing, such as the housing 470 of FIGS. 4A-D. The imaging device 1600 includes the detector circuit 705, the readout circuit 710, the spacer 725, and the contacts (e.g., including the contact 720) of FIGS. 7A and 7B, the alignment frame 1300 of FIG. 13, and an optical element 1603. The optical element 1603 may be, may include, or may be part of the optical element 1403 of FIGS. 14 and 15. The foregoing description of the imaging device 1400 of FIGS. 14 and 15 may generally be applied to the imaging device 1600 of FIGS. 16 and 17.

Figure 18:
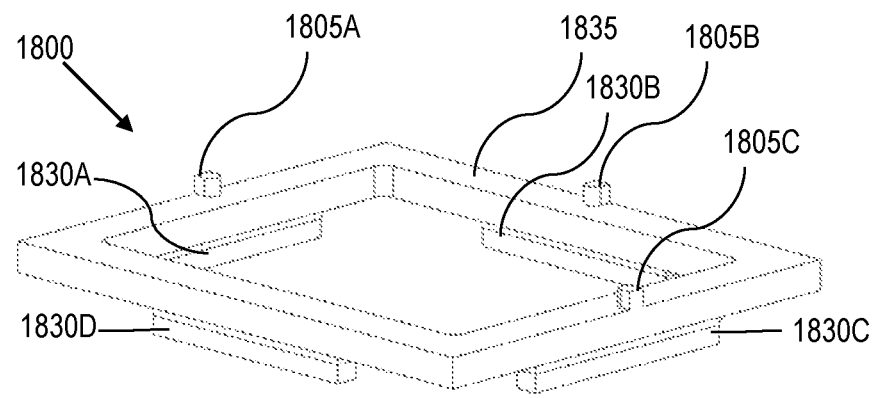
FIG. 18 illustrates a perspective view of an example alignment frame in accordance with one or more embodiments of the present disclosure.

FIG. 18 illustrates a perspective view of an alignment frame 1800 in accordance with one or more embodiments of the present disclosure. The alignment frame 1800 includes legs 1830A-D, a wall 1835, and alignment elements 1805A-C. The foregoing description of the variations of legs, walls, and alignment elements by reference to FIGS. 7A-8 and 12-13 may generally be applied to the legs 1830A-D, wall 1835, and alignment elements 1805A-C of FIG. 18. In an aspect, the alignment frame 1800 may be formed of a material appropriate to block stray light and thus may be utilized as a light shield to block stray light.

Figure 19:
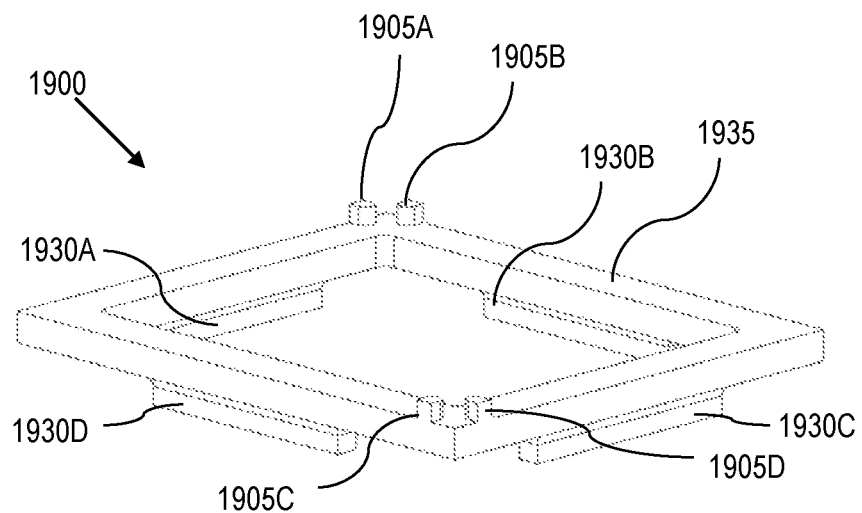
FIG. 19 illustrates a perspective view of an example alignment frame in accordance with one or more embodiments of the present disclosure.

FIG. 19 illustrates a perspective view of an alignment frame 1900 in accordance with one or more embodiments of the present disclosure. The alignment frame 1900 includes legs 1930A-D, a wall 1935, and alignment elements 1905A-D. The foregoing description of the variations of legs, walls, and alignment elements by reference to FIGS. 7A-8, 12-13, and 18 may generally be applied to the legs 1930A-D, a wall 1935, and alignment elements 1905A-D of FIG. 19. While FIGS. 18 and 19 show various numbers and arrangements of alignment elements, in various embodiments, an alignment frame may include any number of alignment elements and various arrangements of alignment elements suitable for a desired application. In an aspect, the alignment frame 1900 may be formed of a material appropriate to block stray light and thus may be utilized as a light shield to block stray light.

Figure 20:
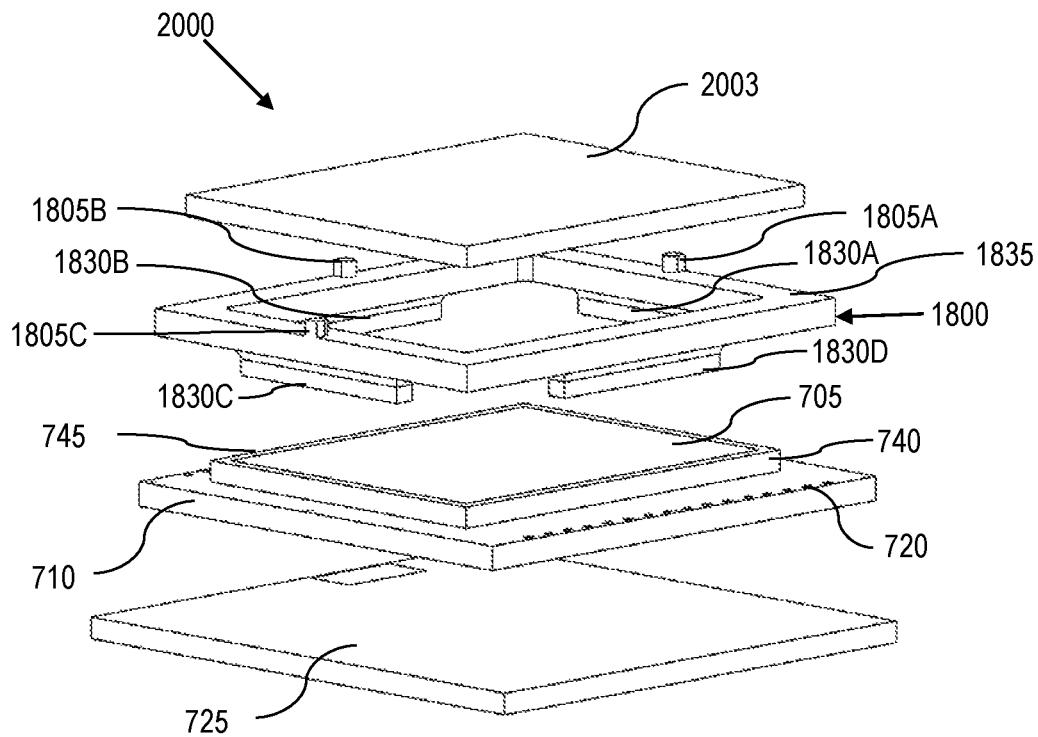
FIG. 20 illustrates an exploded view of an example imaging device in accordance with one or more embodiments of the present disclosure.
Figure 21:
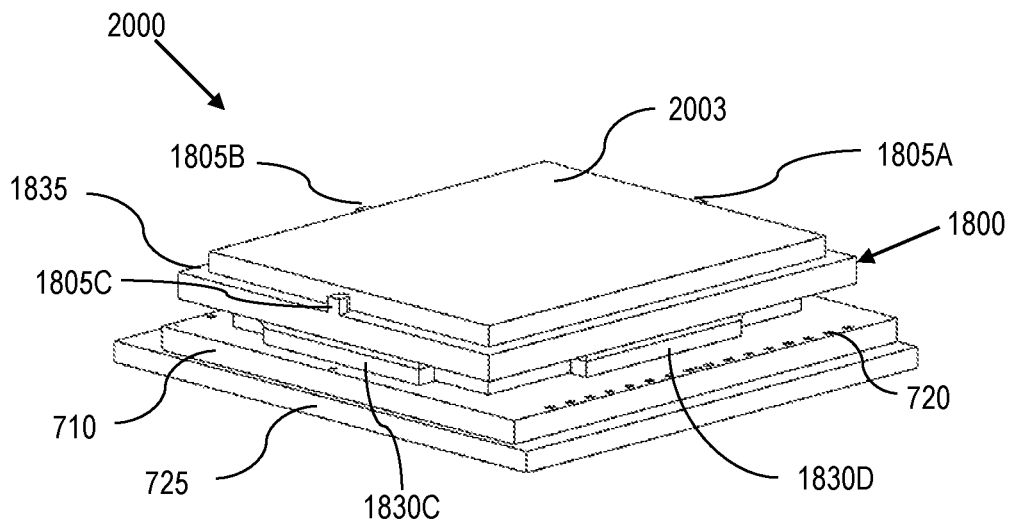
FIG. 21 illustrates a perspective view of the imaging device of FIG. 20 in accordance with one or more embodiments of the present disclosure.

FIG. 20 illustrates an exploded view of an imaging device 2000 in accordance with one or more embodiments of the present disclosure. FIG. 21 illustrates a perspective view of the imaging device 2000 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the imaging device 2000 may be provided within a housing, such as the housing 470 of FIGS. 4A-D. The imaging device 2000 includes the detector circuit 705, the readout circuit 710, the spacer 725, and the contacts (e.g., including the contact 720) of FIGS. 7A and 7B, the alignment frame 1800 of FIG. 18, and an optical element 2003. The optical element 2003 may be, may include, or may be part of the optical element 1603 of FIGS. 16 and 17. The foregoing description of the imaging device 1400 of FIGS. 14 and 15 may generally be applied to the imaging device 2000 of FIGS. 20 and 21.

Figure 22:
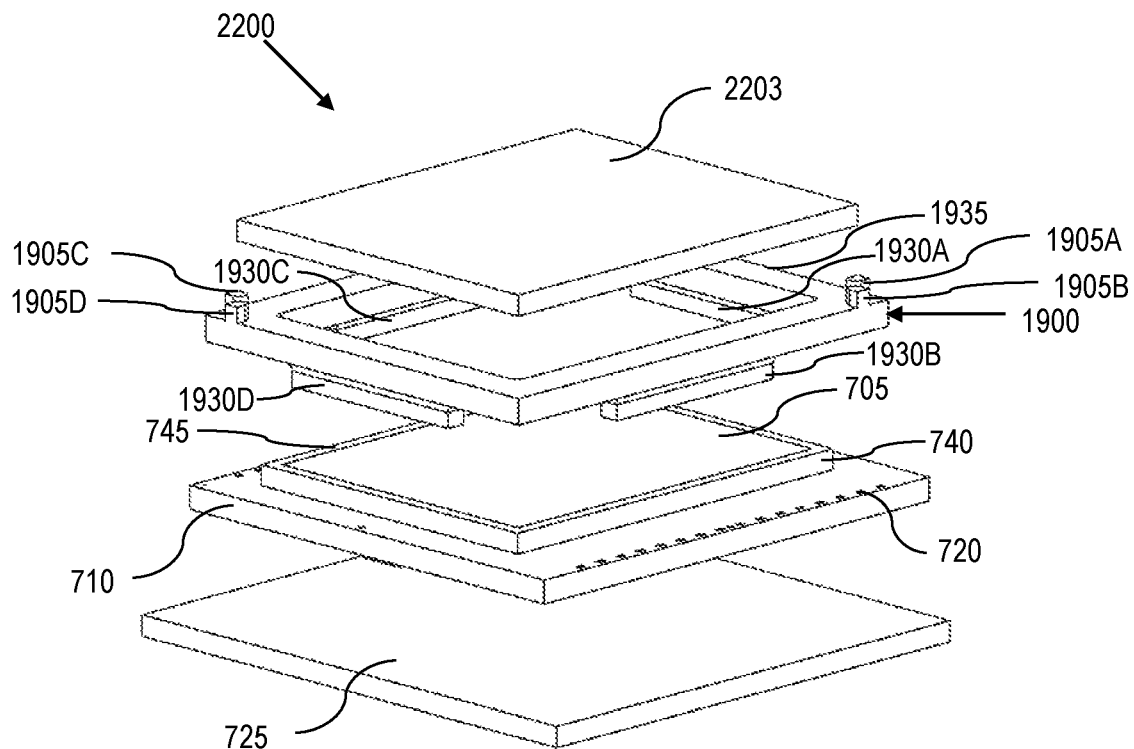
FIG. 22 illustrates an exploded view of an example imaging device in accordance with one or more embodiments of the present disclosure.
Figure 23:
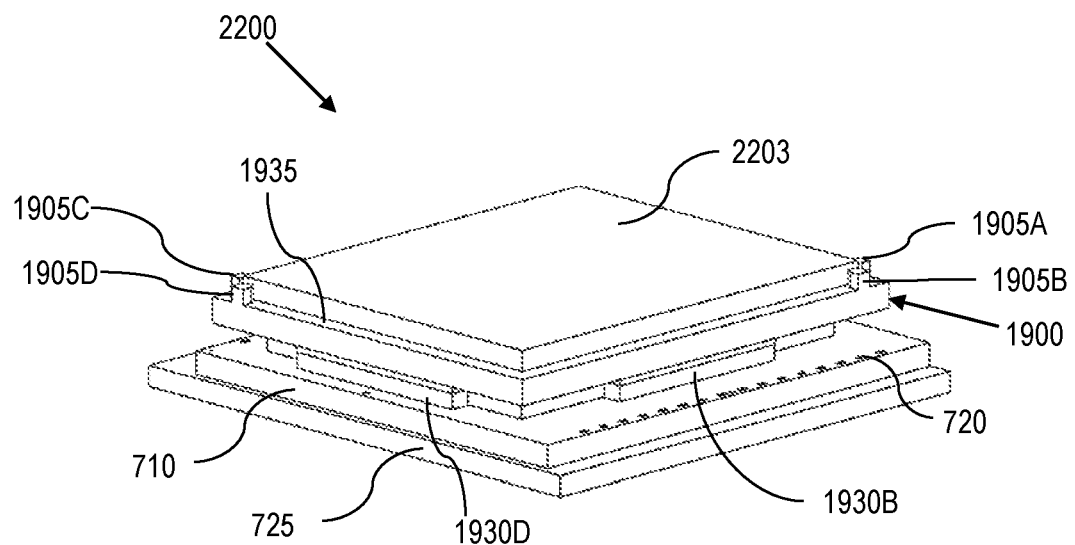
FIG. 23 illustrates a perspective view of the imaging device of FIG. 22 in accordance with one or more embodiments of the present disclosure.

FIG. 22 illustrates an exploded view of an imaging device 2200 in accordance with one or more embodiments of the present disclosure. FIG. 23 illustrates a perspective view of the imaging device 2200 in accordance with one or more embodiments of the present disclosure. Not all of the depicted components may be required, however, and one or more embodiments may include additional components not shown in the figure. Variations in the arrangement and type of the components may be made without departing from the spirit or scope of the claims as set forth herein. Additional components, different components, and/or fewer components may be provided. In an embodiment, the imaging device 2200 may be provided within a housing, such as the housing 470 of FIGS. 4A-D. The imaging device 2200 includes the detector circuit 705, the readout circuit 710, the spacer 725, and the contacts (e.g., including the contact 720) of FIGS. 7A and 7B, the alignment frame 1900 of FIG. 19, and an optical element 2203. The optical element 2203 may be, may include, or may be part of the optical element 2003 of FIGS. 20 and 21. The foregoing description of the imaging device 1400 of FIGS. 14 and 15 may generally be applied to the imaging device 2200 of FIGS. 22 and 23.

Figure 24A:
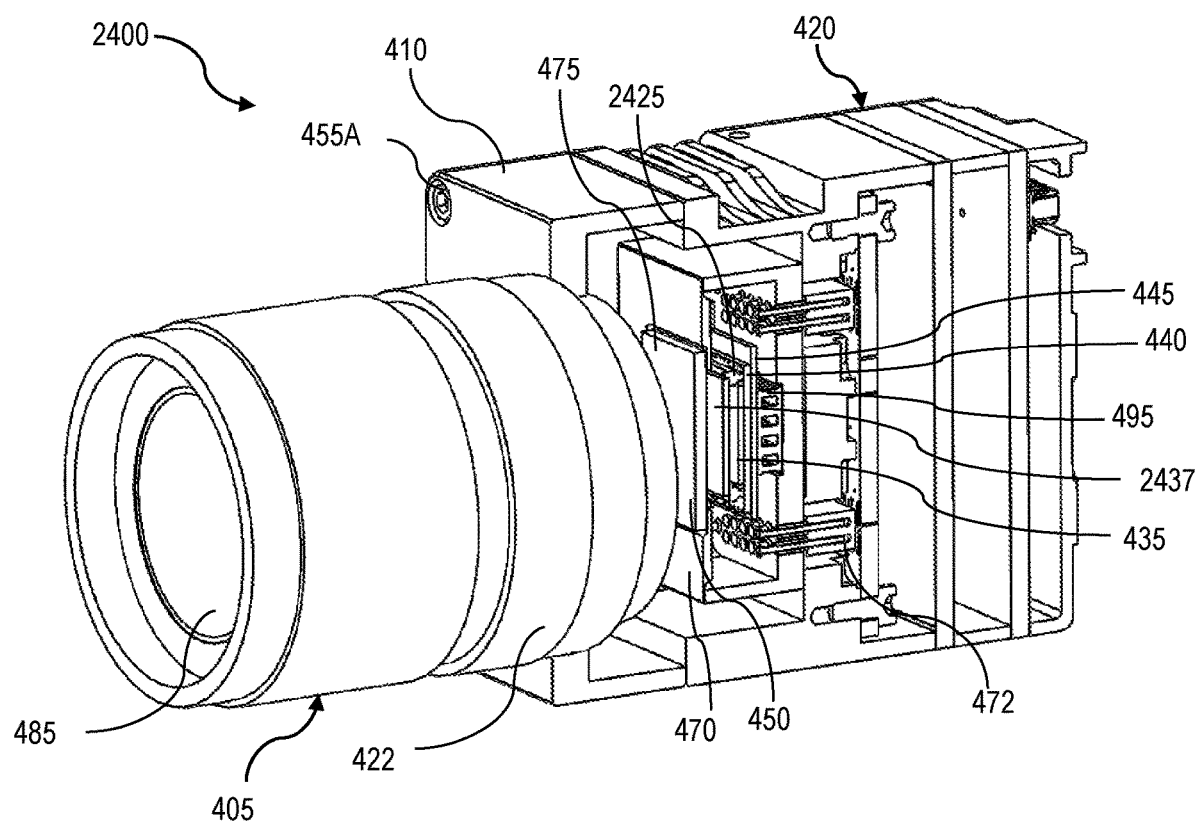
FIG. 24A illustrates a perspective sectional view of an imaging device in accordance with one or more embodiments of the present disclosure.
Figure 24B:
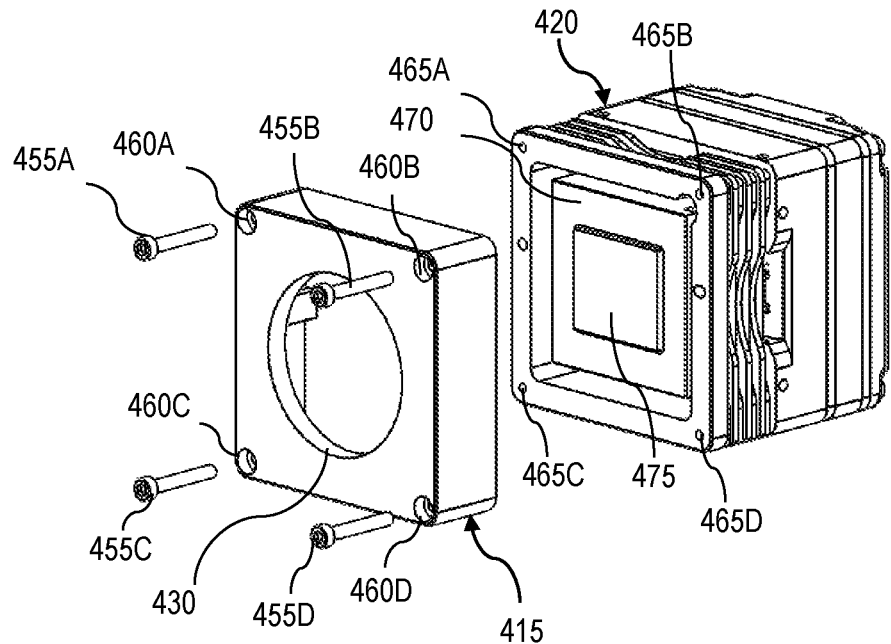
FIG. 24B illustrates an exploded view of the imaging device of FIG. 24A without depicting its lens assembly.
Figure 24C:
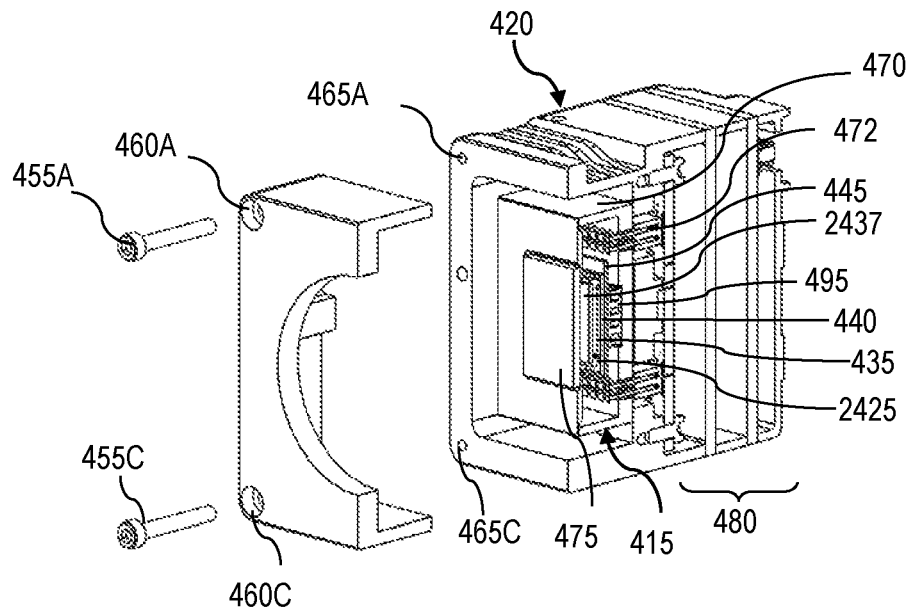
FIG. 24C illustrates a cross-section of the exploded view of FIG. 24B.

FIG. 24A illustrates a perspective sectional view of an imaging device 2400 in which an alignment frame 2425 is implemented in accordance with one or more embodiments of the present disclosure. FIG. 24B illustrates the imaging device 2400 of FIG. 4A without depicting the lens assembly 405 of the imaging device 2400. FIG. 24C illustrates a cross-section of the exploded view of FIG. 24B. In some cases, the imaging device 2400 may be implemented as the imaging system 400 of FIG. 4A or a portion thereof and the description of the components of imaging device 400 may generally be applied to the corresponding components of imaging device 2400. In an embodiment, the imaging device 2400 may be, may include, or may be a part of the image capture component 115 of FIG. 1. Not all of the depicted components may be required, however, and one or more embodiments may include additional components shown in the figures. Variations in the arrangement and type of the components may be made without departing from the spirit or scope of the claims as set forth herein. Additional components, different components, and/or fewer components may be provided.

As shown in FIGS. 24A-C, an optical element 2437 may be aligned, via alignment elements of the alignment frame 2425, with the detector circuit 435 and coupled to the alignment frame 2425. In some embodiments, the optical element 2437 may be, may include, or may be part of the various optical elements described with reference to FIGS. 14-17 and 20-23 (e.g., the optical element 1403, 1603, etc.). In some embodiments, the alignment frame 2425 may be, may include, or may be part of the various embodiments of light shields described with reference to FIGS. 12-23. In an aspect, the alignment frame 2425 may be formed of a material appropriate to block stray light and thus may be utilized as a light shield to block stray light.

Figure 25:
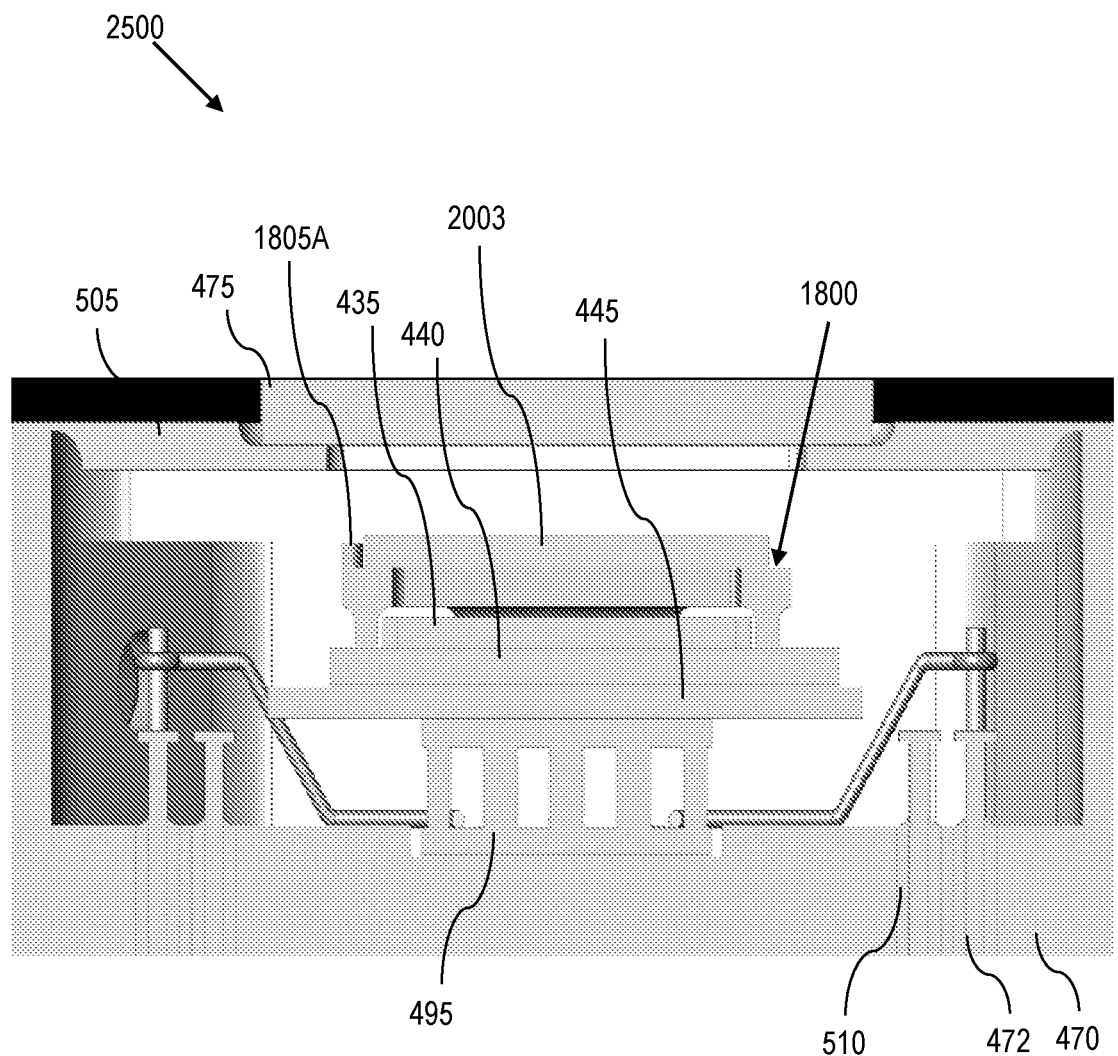
FIG. 25 illustrates a cross section view of an example imager assembly in accordance with one or more embodiments of the present disclosure.
Figure 26:
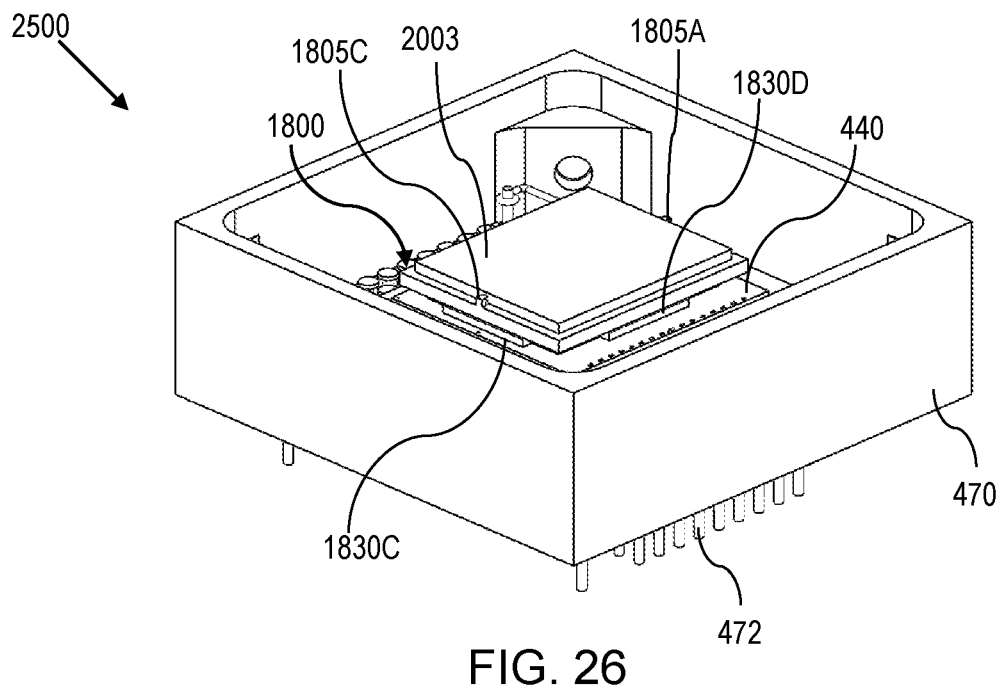
FIG. 26 shows a portion of the imager assembly of FIG. 25 obscured to expose an interior of the imager assembly.

FIG. 25 illustrates an imager assembly 2500 in which the light shield 1800 with alignment elements, including the alignment element 1805A, is implemented in accordance with one or more embodiments of the present disclosure. In particular, FIG. 25 illustrates a sectional view of the imager assembly 2500. FIG. 26 shows a top portion of the imager assembly 2500 obscured to expose an interior of the imager assembly 2500. Not all of the depicted components may be required, however, and one or more embodiments may include additional components shown in the figures. Variations in the arrangement and type of the components may be made without departing from the spirit or scope of the claims as set forth herein. Additional components, different components, and/or fewer components may be provided. The foregoing description of the various components described with reference to FIGS. 5A-C and 20-21 generally apply to the corresponding components of the imager assembly 2500. As shown in FIGS. 25 and 26, the optical element 2003 may be aligned, via alignment elements (e.g., including the alignment element 1805A), with the detector circuit 435, and coupled to the alignment frame 1800 to be in close proximity to the detector circuit 435.

Figure 27:
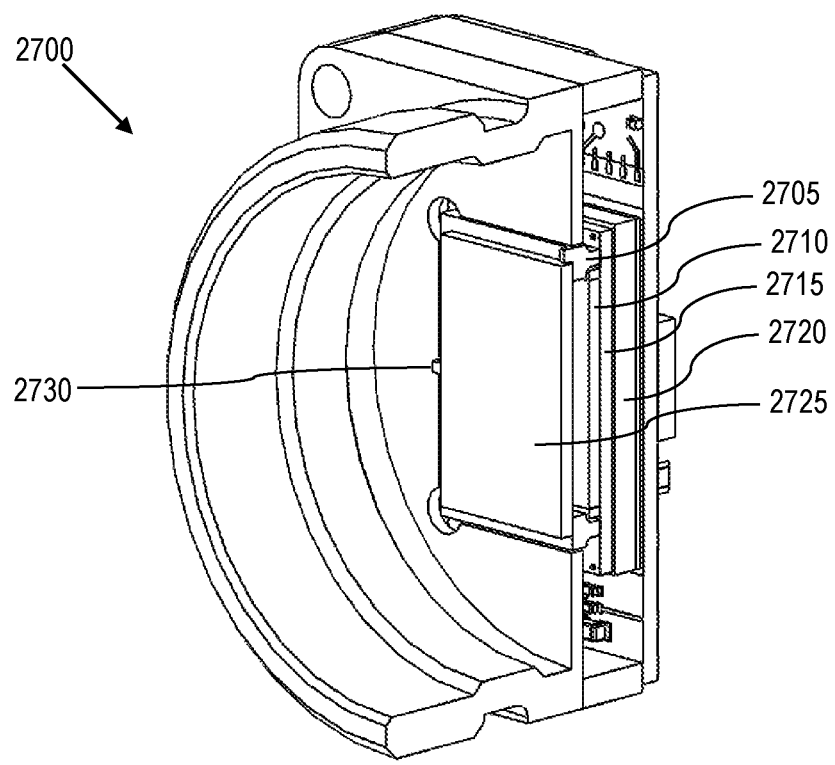
FIG. 27 illustrates an example imaging device in an open-frame device in accordance with one or more embodiments of the present disclosure.

Although the foregoing describes various embodiments in which an imager assembly (e.g., the imager assembly 2500 of FIGS. 25 and 26) may be implemented as a vacuum package assembly, in other embodiments, the imager assembly is not implemented as a vacuum package housing. For example, FIG. 27 illustrates a cross sectional view of the imaging device 2700 in an open-frame device (e.g., open-frame camera) in accordance with one or more embodiments of the present disclosure. The imaging device 2700 includes an alignment frame 2705, a detector circuit 2710, a readout circuit 2715, a spacer 2720, and an optical element 2725. The optical element 2725 may be aligned, via alignment elements (e.g., including an alignment element 2730 of the alignment frame 2705), to be coupled to the alignment frame 2705. The foregoing description for FIG. 10 generally applies to FIG. 27. Description of alignment frames of FIGS. 12-23 may generally apply to the alignment frame 2705 of FIG. 27.

Figure 28:
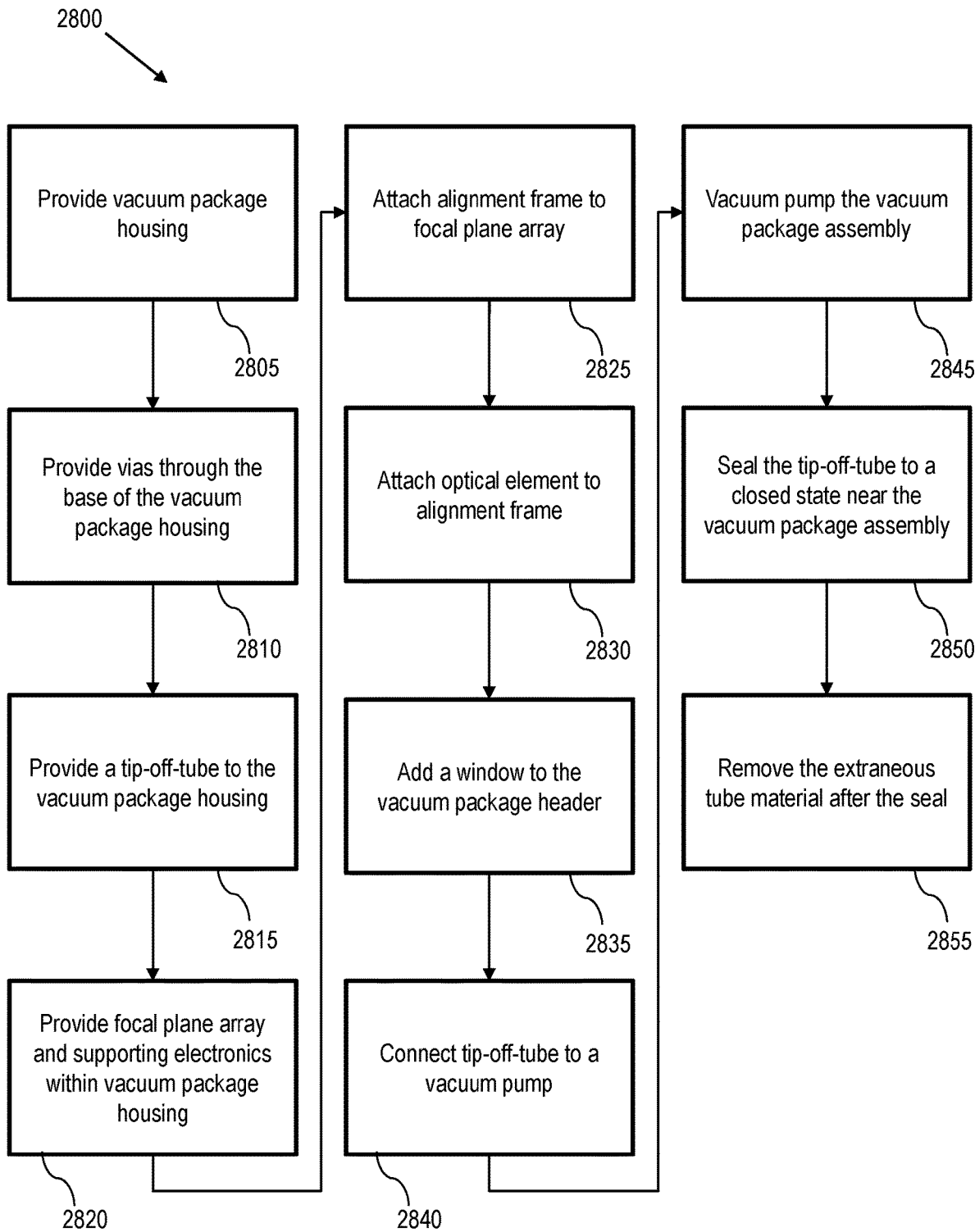
FIG. 28 illustrates a flow diagram of an example process for manufacturing an imaging device in accordance with one or more embodiments of the present disclosure.

FIG. 28 illustrates a flow diagram of an example of a process 2800 for manufacturing an imaging device in accordance with one or more embodiments of the present disclosure. For explanatory purposes, the process 2800 is described herein with reference to various components of one or more of FIGS. 1-8, 12-13, and 18-27; however, the process 2800 is not limited to various components of FIGS. 1-8, 12-13, and 18-27. Note that one or more operations may be combined, omitted, and/or performed in a different order as desired.

At block 2805, a vacuum package housing is provided. In some cases, the vacuum package housing may be the housing 470 of FIG. 4A. The vacuum package housing may be formed of a single integrated structure or of discrete structures (e.g., separately formed walls of the housing) coupled to each other. The vacuum package housing may be substantially rectangular, although other shapes may be utilized. The vacuum package housing may be formed from Kovar, an iron-nickel-cobalt alloy, or 304L stainless steel.

At block 2810, vias are provided through a base of the vacuum package housing. The vias may correspond to the connecting pins (e.g., including the connecting pin 472 of FIG. 4A). The vias may be insulated from the base of the vacuum package housing using insulators (e.g., the insulator 510 of FIG. 5C). Such insulators may also be provided at block 2810. The vias may allow connection of a focal plane array (e.g., formed of at least the detector circuit 435 and the readout circuit 440) and/or supporting electronics (e.g., the supporting electronics 480) disposed within an interior cavity of the vacuum package housing with external electronics.

At block 2815, a tip-off tube (e.g., the tip-off tube 478) in an open state is provided to an aperture in order to provide a vacuum within a completed vacuum package assembly formed from the vacuum package housing. The tip-off tube may be constructed of a metal or other pliable material, such as copper.

In order to attach a window (e.g., the transmissive window 475 of FIG. 4A) so that the tip-off tube forms the only channel between the interior cavity and an external environment, the focal plane array and supporting electronics are added to the vacuum package housing to form the vacuum package assembly. Thus, at block 2820, a focal plane array and supporting electronics are provided within the vacuum package housing. For example, the focal plane array and the supporting electronics may be disposed in the interior cavity of the vacuum package housing. The supporting electronics may be connected to the connecting pins (e.g., the vias) in order to allow for later mounting of the vacuum package assembly and communication of image data.

At block 2825, an alignment frame is attached to the focal plane array. In one aspect, the alignment frame may include a light shield with alignment elements. The alignment frame may be coupled to a readout circuit. For example, the alignment frame may be attached to the focal plane array via adhesive, screws, pins, or other materials. In one case, the alignment frame may be attached to the readout circuit by hand with a Z-scope and an adhesive. In one embodiment, the alignment frame may be one of the alignment frames 1200, 1300, 1800, 1900, or 2425.

At block 2830, an optical element is attached to the alignment frame. In one embodiment, the optical element may be one of the optical elements 1403, 1603, 2003, 2203, or 2437. By way of non-limiting example, the optical element may be a polarizer, Bayer Pattern, or filter attached to the alignment frame. At block 2835, a window (e.g., the transmissive window 475) is added to the vacuum package header. For example, in FIG. 24A, the housing 470 is shown with the transmissive window 475.

Once the window is attached, a vacuum package assembly may be formed that includes the tip-off tube in an open state. In some cases, it may be desirable to maintain a vacuum around the focal plane array and the supporting electronics in the interior cavity. In order to provide a vacuum within the interior cavity, the tip-off tube may be connected to a vacuum pump to substantially evacuate the interior cavity and form the vacuum. At block 2840, the tip-off tube is connected to a vacuum pump. At block 2845, the vacuum package assembly is vacuum pumped. By vacuum pumping the vacuum package assembly, matter is removed from the internal cavity to form a vacuum around the focal plane array and the supporting electronics in the internal cavity.

Once the vacuum is formed, in order to maintain the vacuum, the tip-off tube is changed to a closed state. In this regard, at block 2850, the tip-off tube is sealed to the closed state near the vacuum package assembly. For example, a pinch or crimp seal may be applied to the tip-off tube to close the tip-off tube. The pinch seal may be formed by utilizing a machine roller or other mechanism to pinch seal the tip-off tube by applying pressure to the pinch-off tube on the external surface, such as through a cold weld (e.g., using the heat of the pressure process). The pinch seal may also be formed through another process that seals the tip-off tube while maintaining the vacuum in the interior cavity. At block 2855, after the tip-off-tube is sealed, extraneous tube material is removed from the seal.

Figure 29:
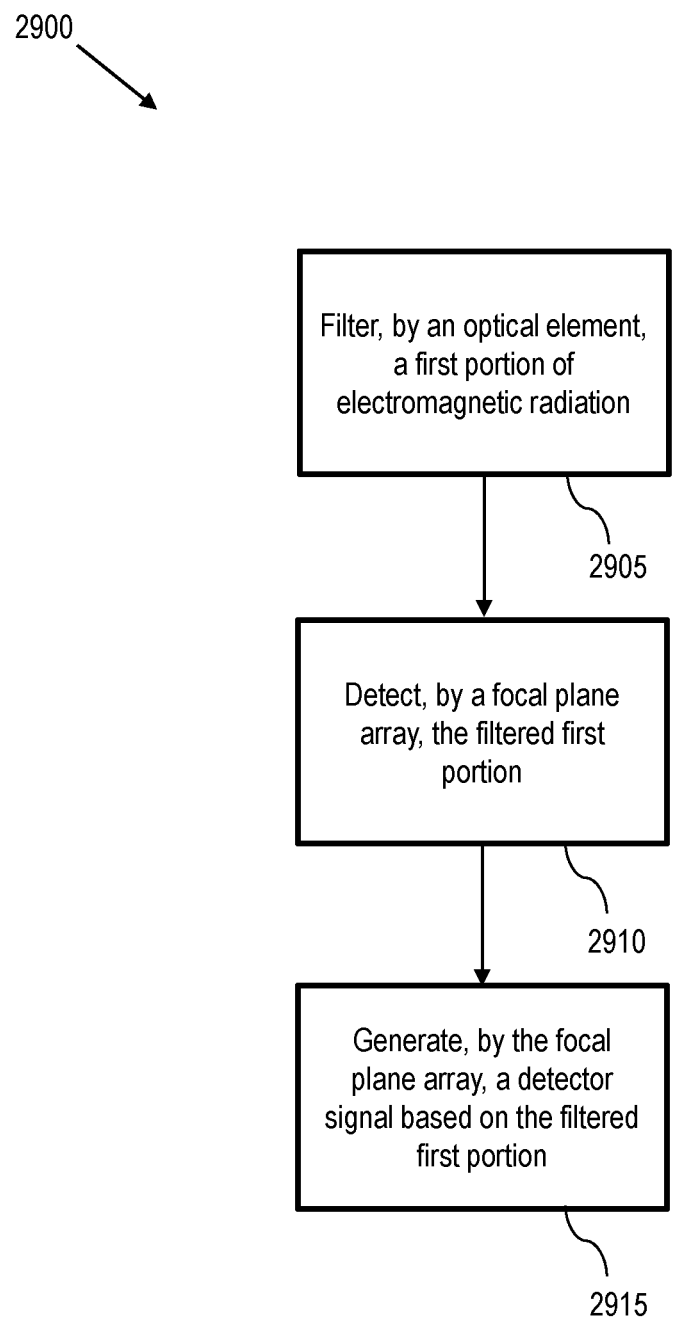
FIG. 29 illustrates a flow diagram of an example process for facilitating imaging in accordance with one or more embodiments of the present disclosure.

FIG. 29 illustrates a flow diagram of an example process 2900 for facilitating imaging in accordance with one or more embodiments of the present disclosure. For explanatory purposes, the process 2900 is described herein with reference to the imaging device 2400 and components thereof shown in FIGS. 24A and 24B; however, the process 2900 is not limited to the imaging device 2400 and components thereof shown in FIGS. 24A and 24B. Note that one or more operations may be combined, omitted, and/or performed in a different order as desired.

At block 2905, an optical element (e.g., optical element 2437) filters a first portion of EM radiation. At block 2910, an FPA (e.g., the detector circuit 435 of an FPA) detects the filtered first portion of the EM radiation. At block 2915, the FPA generates a detector signal based on the filtered first portion.

Figure 30:
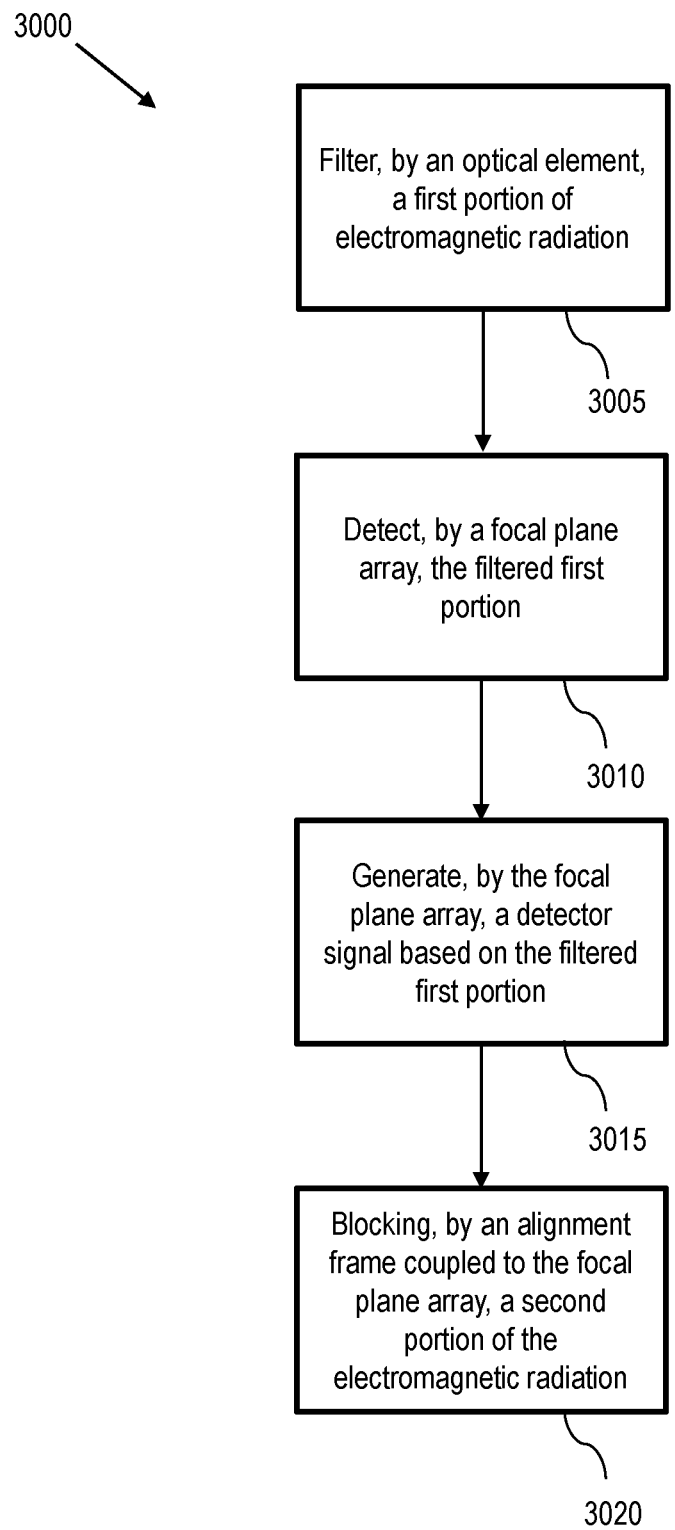
FIG. 30 illustrates a flow diagram of an example process for facilitating imaging in accordance with one or more embodiments of the present disclosure.

FIG. 30 illustrates a flow diagram of an example process 3000 for facilitating imaging in accordance with one or more embodiments of the present disclosure. For explanatory purposes, the process 3000 is described herein with reference to the imaging device 2400 and components thereof shown in FIGS. 24A and 24B; however, the process 3000 is not limited to the imaging device 2400 and components thereof shown in FIGS. 24A and 24B. Note that one or more operations may be combined, omitted, and/or performed in a different order as desired. In FIG. 30, an alignment frame may be appropriately formed to function as a light shield.

At block 3005, an optical element (e.g., the optical element 2437) filters a first portion of EM radiation. At block 3010, an FPA (e.g., the detector circuit 435 of an FPA) detects the filtered first portion of EM radiation. At block 3015, the FPA generates a detector signal based on the filtered first portion. At block 3020, an alignment frame (e.g., the alignment frame 2425) formed around the FPA blocks a second portion of the EM radiation (e.g., to mitigate an effect of the second portion on the detector signal). The optical element may be coupled to a surface of the alignment frame and aligned with the detector circuit of the FPA via alignment elements. The second portion may include stray light that is directed to one or more edges of the detector circuit 435. In some cases, a waveband(s) associated with the first portion of the EM radiation may overlap at least a portion of a waveband(s) associated with the second portion of the EM radiation. In some aspects, a light shield disposed over a portion of the detector circuit 435 and a portion of the alignment frame 2425 blocks a third portion of the EM radiation. In some cases, the second portion may include residual EM radiation from the third portion that passes the second light shield and/or other stray EM radiation. In an embodiment, the alignment frame 2425 may block stray EM radiation by absorbing the stray EM radiation whereas the second light shield may block stray EM radiation by scattering the stray EM radiation.

Where applicable, various embodiments provided by the present disclosure can be implemented using hardware, software, or combinations of hardware and software. Also where applicable, the various hardware components and/or software components set forth herein can be combined into composite components comprising software, hardware, and/or both without departing from the spirit of the present disclosure. Where applicable, the various hardware components and/or software components set forth herein can be separated into sub-components comprising software, hardware, or both without departing from the spirit of the present disclosure. In addition, where applicable, it is contemplated that software components can be implemented as hardware components, and vice versa.

Software in accordance with the present disclosure, such as non-transitory instructions, program code, and/or data, can be stored on one or more non-transitory machine-readable mediums. It is also contemplated that software identified herein can be implemented using one or more general purpose or specific purpose computers and/or computer systems, networked and/or otherwise. Where applicable, the ordering of various steps described herein can be changed, combined into composite steps, and/or separated into sub-steps to provide features described herein.

The foregoing description is not intended to limit the present disclosure to the precise forms or particular fields of use disclosed. Embodiments described above illustrate but do not limit the invention. It is contemplated that various alternate embodiments and/or modifications to the present invention, whether explicitly described or implied herein, are possible in light of the disclosure. Accordingly, the scope of the invention is defined only by the following claims.

What is claimed is:

1. An imaging system comprising:
   a focal plane array (FPA) comprising:
      a detector array configured to detect a first portion of electromagnetic radiation and generate a detector signal based on the first portion; and
      a readout circuit coupled to the detector array and configured to receive the detector signal; and
   a first light shield coupled to the FPA and configured to block a second portion of the electromagnetic radiation, wherein the first light shield comprises:
      a leg configured to couple to the FPA; and
      a wall extending from the leg.

2. The imaging system of claim 1, further comprising a second light shield disposed over a portion of the detector array and a portion of the first light shield, wherein the second light shield is configured to block a third portion of the electromagnetic radiation.

3. The imaging system of claim 1, wherein the first light shield forms a continuous perimeter around the detector array and is configured to block the second portion by absorbing the second portion, and wherein a waveband associated with the first portion overlaps at least a portion of a waveband associated with the second portion.

4. An imaging system comprising:
   a focal plane array (FPA) comprising:
      a detector array configured to detect a first portion of electromagnetic radiation and generate a detector signal based on the first portion; and
      a readout circuit coupled to the detector array and configured to receive the detector signal;
   a first light shield coupled to the FPA and configured to block a second portion of the electromagnetic radiation, wherein the first light shield forms a continuous perimeter around the detector array and is configured to block the second portion by absorbing the second portion, and wherein a waveband associated with the first portion overlaps at least a portion of a waveband associated with the second portion;
   a vacuum package housing, wherein the FPA and the first light shield are enclosed in the vacuum package housing; and
   a second light shield enclosed in the vacuum package housing and disposed over a portion of the detector array and a portion of the first light shield, wherein the second light shield is configured to block a third portion of the electromagnetic radiation.

5. The imaging system of claim 1, wherein the second portion comprises a portion of the electromagnetic radiation directed to an edge of the detector array, and wherein a portion of the first light shield extends over a vertical edge of the detector array.

6. The imaging system of claim 4, wherein the first light shield comprises:
   a leg configured to couple to the FPA; and
   a wall extending from the leg.

7. The imaging system of claim 1, further comprising a plurality of additional legs, wherein the leg is a first leg, wherein the first leg and each of the plurality of additional legs is coupled to the readout circuit, and wherein a height of the first light shield is greater than a height of the detector array.

8. The imaging system of claim 1, wherein the FPA further comprises a bond pad, wherein a thickness of the leg is less than a distance between an edge of the detector array and the bond pad, and wherein the wall has a T-shaped or an L-shaped cross-section.

9. The imaging system of claim 1, wherein the first light shield further comprises at least one alignment element extending from the wall and configured to align an optical element with the detector array.

10. The imaging system of claim 9, wherein the at least one alignment element comprises at least three alignment elements, and wherein the first light shield is configured to form a continuous perimeter around the detector array.

11. The imaging system of claim 9, further comprising the optical element coupled to the at least one alignment element and the wall, wherein the optical element is configured to filter a third portion of the electromagnetic radiation to obtain the first portion.

12. The imaging system of claim 11, further comprising a window disposed over the optical element, wherein a portion of the wall is configured to extend over a vertical edge of the detector array, and wherein interior surfaces of a portion of the first light shield face exterior surfaces of the detector array.

13. A method of manufacturing the imaging system of claim 1, the method comprising:
   providing the FPA; and
   coupling the first light shield to the FPA such that interior surfaces of a portion of the first light shield face exterior surfaces of the detector array.

14. The method of claim 13, further comprising:
   disposing the FPA and the first light shield within a package assembly; and
   coupling a second light shield to the package assembly, wherein the second light shield is disposed over a portion of the detector array and a portion of the first light shield, and wherein the second light shield is configured to block a third portion of the electromagnetic radiation.

15. The method of claim 14, further comprising coupling, using at least one alignment element of the first light shield, an optical element to the package assembly to align the optical element with the detector array.

16. A method comprising:
   detecting, by a focal plane array that comprises a detector array and a readout circuit, a first portion of electromagnetic radiation;
   generating, by the focal plane array, a detector signal based on the first portion; and
   blocking, by a first light shield coupled to the focal plane array, a second portion of the electromagnetic radiation from the detector array by absorbing the second portion, wherein the first light shield comprises:
      a leg in contact with the readout circuit; and
      a wall extending from the leg.

17. The method of claim 16, further comprising filtering, by an optical element coupled to the first light shield, a third portion of the electromagnetic radiation to obtain the first portion of the electromagnetic radiation.

18. The method of claim 17, wherein the optical element is coupled to the first light shield using at least one alignment element of the first light shield.

19. The method of claim 18, wherein:
- the second portion comprises a portion of the electromagnetic radiation directed to an edge of the detector array;
- a portion of the wall extends over a vertical edge of the detector array; and
- the first light shield further comprises:
  - the at least one alignment element extending from the wall and configured to align the optical element with the detector array.

20. The method of claim 16, further comprising blocking, by a second light shield, a third portion of the electromagnetic radiation from the detector array by scattering the third portion, wherein the second light shield is disposed over a portion of the detector array and a portion of the first light shield.

* * * * *

UNITED STATES PATENT AND TRADEMARK OFFICE
CERTIFICATE OF CORRECTION

PATENT NO.         : 12,212,822 B2
APPLICATION NO.    : 17/428267
DATED              : January 28, 2025
INVENTOR(S)        : Royce Duane Clay, Jr. et al.

Page 1 of 1

It is certified that error appears in the above-identified patent and that said Letters Patent is hereby corrected as shown below:

In the Specification

Column 20, Line 4, change "U.S. patent application Ser. No." to --U.S. Patent Application No.--.

Signed and Sealed this
Fourth Day of March, 2025

Coke Morgan Stewart
*Acting Director of the United States Patent and Trademark Office*